US012588303B2

(12) United States Patent
Jung et al.

(10) Patent No.: US 12,588,303 B2
(45) Date of Patent: Mar. 24, 2026

(54) IMAGE SENSOR WITH SHARED EXTRINSIC REGION

(71) Applicant: SAMSUNG ELECTRONICS CO., LTD., Suwon-si (KR)

(72) Inventors: Daeuk Jung, Suwon-si (KR);
Youngrae Kim, Suwon-si (KR);
Jeongjin Cho, Suwon-si (KR);
Sachoun Park, Suwon-si (KR);
Junghyung Pyo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/746,917

(22) Filed: Jun. 18, 2024

(65) Prior Publication Data

US 2025/0040270 A1 Jan. 30, 2025

(30) Foreign Application Priority Data

Jul. 25, 2023 (KR) ........................ 10-2023-0096921

(51) Int. Cl.
*H10F 39/00* (2025.01)
*H10F 39/18* (2025.01)

(52) U.S. Cl.
CPC ......... *H10F 39/8023* (2025.01); *H10F 39/18* (2025.01); *H10F 39/182* (2025.01); *H10F 39/803* (2025.01); *H10F 39/8037* (2025.01); *H10F 39/8063* (2025.01); *H10F 39/807* (2025.01); *H10F 39/811* (2025.01); *H10F 39/813* (2025.01)

(58) Field of Classification Search
CPC .. H10F 39/8023; H10F 39/182; H10F 39/811; H10F 39/803; H10F 39/807; H10F 39/813; H10F 39/8037; H10F 39/18; H10F 39/8063; H10F 39/802
See application file for complete search history.

(56) References Cited

U.S. PATENT DOCUMENTS

| | | | |
|---|---|---|---|
| 5,270,531 A | 12/1993 | Yonemoto | |
| 9,293,501 B2 | 3/2016 | Ahn | |
| 11,302,737 B2 * | 4/2022 | Lee ....................... | H10F 39/811 |
| 11,575,847 B2 | 2/2023 | Koga | |

(Continued)

*Primary Examiner* — Georgia Y Epps
*Assistant Examiner* — Erin R Garber
(74) *Attorney, Agent, or Firm* — Sughrue Mion, PLLC

(57) ABSTRACT

An image sensor includes a substrate, a plurality of photodiodes in the substrate, a pixel separating pattern in the substrate separating the plurality of photodiodes, a first active pattern in the substrate at least partially overlapping a first photodiode and a second photodiode from among the plurality of photodiodes, a selection gate on the first active pattern at least partially overlapping the first photodiode, and a source follower gate on the first active pattern at least partially overlapping the second photodiode. The first photodiode is adjacent to the second photodiode. The pixel separating pattern includes a first pixel separating pattern and a second pixel separating pattern disposed between the first photodiode and the second photodiode. The first pixel separating pattern is spaced from the second pixel separating pattern. The first active pattern includes a first extrinsic region disposed between the first pixel separating pattern and the second pixel separating pattern.

18 Claims, 21 Drawing Sheets

(56)        References Cited

U.S. PATENT DOCUMENTS

| | | |
|---|---|---|
| 2021/0203866 A1 | 7/2021 | Koga |
| 2022/0013552 A1* | 1/2022 | Baek ..................... H10F 39/813 |
| 2022/0149092 A1 | 5/2022 | Kang et al. |
| 2022/0223636 A1* | 7/2022 | Kim .................... H10F 39/8053 |
| 2022/0336506 A1 | 10/2022 | Lee |
| 2022/0344393 A1 | 10/2022 | Choi et al. |
| 2022/0384502 A1 | 12/2022 | Park et al. |
| 2022/0399384 A1 | 12/2022 | Cho et al. |
| 2023/0420468 A1* | 12/2023 | Miki .................... H10F 39/807 |

* cited by examiner

PD: PD1, PD2, PD3, PD4, PD5, PD6, PD7, PD8

ACT1
ACT2
ACT3
ACT4
ACT5: FD1, FD2, FD3, FD4,
FD5, FD6, FD7, FD8
ACT6: GND1, GND2, GND3,
GND4, DMY_A

GL: SEL1, SEL2, SF, DCG1, DCG2,
RG, DMY_G, TG1~TG8
MI: TWR, GWR, SEWR, FWR,
RWR, DWR1, DWR2,
EP1, EP2, WR1, WR2, WR3

ACT1: ACT1_R1, ACT1_R2, ACT1_R3
GL: SEL1, SF1
M1: WR1, SEWR, FWR

PD: PD1, PD2, PD3, PD4, PD5, PD6, PD7, PD8

PD: PD1, PD2, PD3, PD4, PD5, PD6, PD7, PD8

PD: PD1, PD2, PD3, PD4, PD5, PD6, PD7, PD8

PD: PD1, PD2, PD3, PD4, PD5, PD6, PD7, PD8

5200

5400

1

IMAGE SENSOR WITH SHARED EXTRINSIC REGION

CROSS-REFERENCE TO RELATED APPLICATIONS

This application claims benefit of priority under 35 U.S.C. § 119 to Korean Patent Application No. 10-2023-0096921, filed on Jul. 25, 2023, in the Korean Intellectual Property Office, the disclosure of which is incorporated by reference herein in its entirety.

BACKGROUND

1. Field

The present disclosure relates generally to an image sensor, and more particularly, to an image sensor with a shared extrinsic region.

2. Description of Related Art

A complementary metal-oxide semiconductor (CMOS) image sensor may refer to a solid-state imaging device using a CMOS technology. Compared to charged-coupled device (CCD) image sensors with a high-voltage analog circuit, CMOS image sensors may have advantages of low manufacturing cost and low power consumption due to a small size of a related CMOS-based device in relation to a CCD-based device. Consequently, CMOS-based devices may be preferred to be installed in devices such as, but not limited to, home appliances and portable devices (e.g., smartphones, digital cameras), and the like.

A pixel array configuring a CMOS image sensor may include a photoelectric conversion element (e.g., a photodiode) for each pixel. For example, the photodiode may generate an electrical signal that may vary according to an amount of incident light, and the CMOS image sensor may synthesize an image by processing the generated electrical signal.

Recently, in order to meet increasing demands for high-resolution images, pixel sizes of CMOS image sensors may need to be further down-sized and/or reduced. However, as demand for down-sizing pixel sizes increases, CMOS image sensors may not be able to properly sense light incident on the CMOS image sensors. Alternatively or additionally, noise may occur between elements of the CMOS image sensors due to interference between the elements of the CMOS image sensors having increased integration (e.g., smaller form factor, reduced spacing between the elements).

Thus, there exists a need for further improvements in CMOS image sensor technology, as demands for high-resolution images, reduced pixel sizes, and additional functions may be constrained by quality issues due to increased integration. Improvements related to diversifying positioning among elements of a CMOS image sensor are presented herein. These improvements may also be applicable to other semiconductor technologies.

SUMMARY

One or more example embodiments of the present disclosure provide an image sensor with potentially improved optical characteristics when compared to related image sensors.

According to an aspect of the present disclosure, an image sensor includes a substrate, a plurality of photodiodes in the substrate, a pixel separating pattern in the substrate and configured to separate the plurality of photodiodes, a first active pattern in the substrate and configured to at least partially overlap a first photodiode and a second photodiode from among the plurality of photodiodes, a selection gate on the first active pattern and configured to at least partially overlap the first photodiode, and a source follower gate on the first active pattern and configured to at least partially overlap the second photodiode. The first photodiode is adjacent to the second photodiode. The pixel separating pattern includes a first pixel separating pattern and a second pixel separating pattern disposed between the first photodiode and the second photodiode. The first pixel separating pattern is spaced from the second pixel separating pattern. The first active pattern includes a first extrinsic region disposed between the first pixel separating pattern and the second pixel separating pattern.

According to an aspect of the present disclosure, an image sensor includes a substrate, a plurality of photodiodes in the substrate, a pixel separating pattern in the substrate and configured to separate the plurality of photodiodes, a first active pattern in the substrate and configured to at least partially overlap a first photodiode and a second photodiode from among the plurality of photodiodes, a second active pattern in the substrate and configured to at least partially overlap a third photodiode and a fourth photodiode from among the plurality of photodiodes, a source follower gate on the first active pattern and the second active pattern and configured to at least partially overlap the second photodiode and the fourth photodiode, a first selection gate on the first active pattern and configured to at least partially overlap the first photodiode, and a second selection gate on the second active pattern and configured to at least partially overlap the third photodiode. The first photodiode is adjacent to the second photodiode. The third photodiode is adjacent to the fourth photodiode in a second direction. The second direction crosses the first photodiode and the second photodiode in a first direction different from the second direction. The pixel separating pattern includes a first pixel separating pattern and a second pixel separating pattern disposed between the first photodiode and the second photodiode, and a third pixel separating pattern and a fourth pixel separating pattern disposed between the third photodiode and the fourth photodiode. The first pixel separating pattern and the second pixel separating pattern are separated from each other. The third pixel separating pattern and the fourth pixel separating pattern are separated from each other. The first active pattern includes a first extrinsic region disposed between the first pixel separating pattern and the second pixel separating pattern. The second active pattern includes a second extrinsic region disposed between the third pixel separating pattern and the fourth pixel separating pattern.

According to an aspect of the present disclosure, an image sensor includes a substrate including a first side and a second side facing each other, a plurality of photodiodes in the substrate, a pixel separating pattern separating the plurality of photodiodes in the substrate, an active pattern on an inner side from the first side of the substrate and configured to at least partially overlap a first photodiode and a second photodiode from among the plurality of photodiodes, a selection gate on the active pattern and configured to at least partially overlap the first photodiode, a source follower gate spaced from the selection gate on the active pattern and configured to at least partially overlap the second photodiode, and a micro lens on the second side of the substrate. The first photodiode is adjacent to the second photodiode.

The pixel separating pattern includes a first pixel separating pattern and a second pixel separating pattern disposed between the first photodiode and the second photodiode. The first pixel separating pattern is spaced from the second pixel separating pattern. The active pattern includes a first extrinsic region disposed between the first pixel separating pattern and the second pixel separating pattern.

Further, one or more example embodiments of the present disclosure provide for a selection gate transistor and a source follower transistor configuring an image sensor that share an extrinsic region. Consequently, the design of disposing the source follower gate may be diversified to potentially improve the electric characteristic of the source follower transistor, when compared to related image sensors.

Additional aspects may be set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure may be more apparent from the following description taken in conjunction with the accompanying drawings, in which.

DETAILED DESCRIPTION

Figure 1:
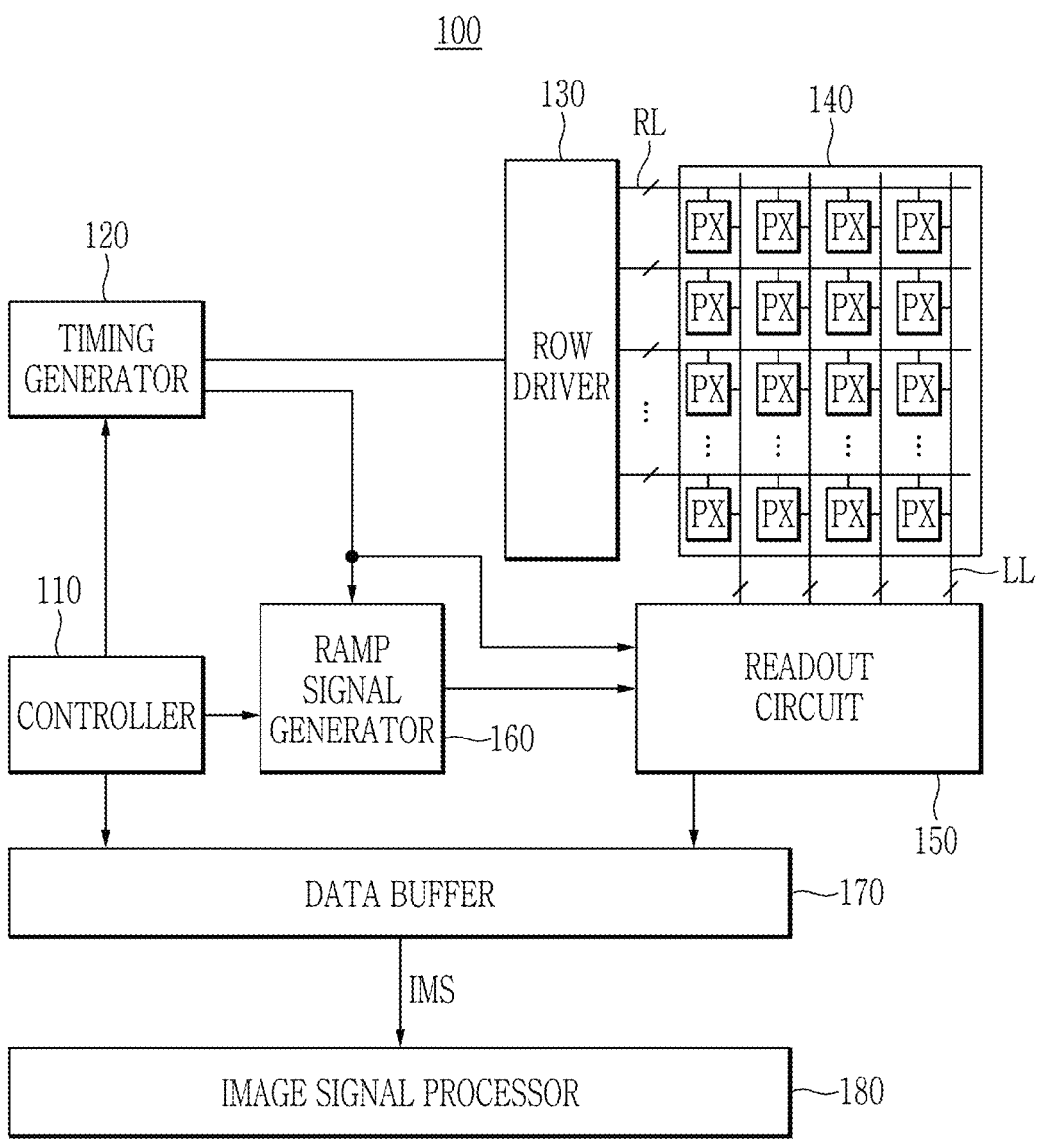
FIG. 1 shows a block diagram of an image sensor, according to an embodiment.

In the following detailed description, only certain embodiments of the present disclosure have been shown and described, simply by way of illustration. As those skilled in the art would realize, the described embodiments may be modified in various different ways, all without departing from the spirit or scope of the present disclosure.

The drawings and description are to be regarded as illustrative in nature and not restrictive, and like reference numerals may designate like elements throughout the specification.

The size and thickness of configurations shown in the drawings may be arbitrarily shown for better understanding and ease of description. However, the present disclosure is not limited thereto. In the drawings, the thickness of layers, films, panels, regions, and the like, may be enlarged for clarity. The thicknesses of some layers and areas may be exaggerated for convenience of explanation.

It is to be understood that when an element such as, but not limited to, a layer, film, region, or substrate is referred to as being "on" another element, the element may be directly on the other element or intervening elements may also be present. Alternatively or additionally, when an element is referred to as being "directly on" another element, there may be no intervening elements present. As used herein, the terms "on" or "above" may refer to an element being positioned on or below the object portion, and may not necessarily refer to being positioned on the upper side of the object portion based on a gravitational direction.

Unless explicitly described to the contrary, the word "comprise", and variations such as "comprises" or "comprising", are to be understood to imply the inclusion of stated elements but not the exclusion of any other elements.

As used herein, the phrase "in a plan view" may refer to viewing an object portion from the top, and the phrase "in a cross-sectional view" may refer to viewing a cross-section of which the object portion is vertically cut from the side.

It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and may not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it may indicate that the element may be coupled with the other element directly (e.g., wired), wirelessly, or via a third element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

The embodiments herein may be described and illustrated in terms of blocks, as shown in the drawings, which carry out a described function or functions. These blocks, which may be referred to herein as units or modules or the like, or by names such as device, logic, circuit, controller, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like.

As used herein, each of the terms "AIO", "HfO", "GaAs", "GaSb", "InAs", "InP", "InSb", "PbTe", "SiGe", "SiO", "SiON", "SiN", and the like may refer to a material made of elements included in each of the terms and is not a chemical formula representing a stoichiometric relationship.

Hereinafter, various embodiments of the present disclosure are described with reference to the accompanying drawings.

An image sensor, according to one or more embodiments, is described with reference to FIG. 1 to FIG. 9.

FIG. 1 shows a block diagram of an image sensor, according to an embodiment.

Referring to FIG. 1, the image sensor 100 may include a pixel array 140 and a logic circuit for controlling the pixel array 140.

The logic circuit may control the pixel array 140, and may include, for example, a controller 110, a timing generator 120, a row driver 130, a readout circuit 150, a ramp signal generator 160, and a data buffer 170.

The image sensor 100 may further include an image signal processor 180. In some embodiments, the image signal processor 180 may be disposed outside the image sensor 100. The image sensor 100 may generate image signals IMS by converting light received from the outside into electrical signals. The image signals IMS may be provided to the image signal processor 180.

The image sensor 100 may be mounted on an electronic device having an image and/or light sensing function. For example, the image sensor 100 may be mounted on an electronic device such as, but not limited to, a camera, a smartphone, a wearable device, an Internet of things (IoT) device, a home appliance, a tablet personal computer (PC), a navigation device, a drone, an advanced driver assistance system (ADAS), and the like.

Further, the image sensor 100 may be mounted on the electronic device and may be provided as a component in a vehicle, furniture, a manufacturing facility, a door, various measurement devices, and the like.

The pixel array 140 may include pixels PX, and row lines RL and column lines CL that may be respectively connected to the pixels PX.

In an embodiment, each of the pixels PX may include at least one photodiode (not shown). The photodiode may sense incident light, and may convert the incident light into electrical signals according to an amount of the light. That is, the photodiode may generate analog pixel signals based on the amount of incident light.

The photodiode may be and/or may include a photodiode (e.g., photodiodes PD of FIG. 2), a pinned diode, and the like. Alternatively or additionally, the photodiode may be and/or may include a single-photon avalanche diode (SPAD) that may be applied to a 3D sensor pixel.

The level of the analog pixel signal output from the photodiode may be proportional to an amount of charges output from the photodiode. That is, the level of the analog pixel signal output from the photodiode may be determined according to an amount of light received into the pixel array 140.

The row lines RL may be connected (e.g., coupled) to the pixels PX. For example, a control signal output to the row line RL from the row driver 130 may be transmitted to a gate of a transistor of the pixels PX connected to the corresponding row line RL. The column lines CL may cross the row lines RL and may be connected (e.g., coupled) to the pixels PX. The analog pixel signals output by the pixels PX may be transmitted to the readout circuit 150 through the column lines CL.

In an embodiment, the pixels PX may be disposed along the columns and the rows, and each pixel PX may output an analog pixel signal. However, the present disclosure is not limited thereto, and numerous variations may be possible. For example, the pixels PX may be grouped in the form of columns and rows to configure one unit pixel. One unit pixel may include the pixels PX arranged in the form of two columns and two rows, and one unit pixel may output the analog pixel signal.

The controller 110 may control operation timings of the above-described constituent elements (e.g., timing generator 120, row driver 130, readout circuit 150, ramp signal generator 160, and data buffer 170) by using control signals.

In an embodiment, the controller 110 may receive a mode signal indicating an imaging mode from an application processor (e.g., image signal processor 180), and may control overall operation of the image sensor 100 based on the received mode signal. For example, the application processor may determine the imaging mode of the image sensor 100 according to various scenarios such as, but not limited to, illumination of the imaging environment, user's resolution setting, a sensed and/or learned state, and the like, and may provide the determined result to the controller 110 as a mode signal.

The controller 110 may control the pixels PX of the pixel array 140 to output analog pixel signals according to the imaging mode. The pixel array 140 may output analog pixel signals for the respective pixels PX and/or analog pixel signals for some of the pixels PX. The readout circuit 150 may sample and/or process the analog pixel signals transmitted from the pixel array 140.

The timing generator 120 may generate a signal serving as a reference for the operation timing of the components of the image sensor 100. For example, the timing generator 120 may control the timings of the row driver 130, the readout circuit 150, and the ramp signal generator 160. The timing generator 120 may provide control signals for controlling the timings of the row driver 130, the readout circuit 150, and the ramp signal generator 160.

The row driver 130 may generate a control signal for driving the pixel array 140 in response to the control signal of the timing generator 120, and may provide control signals to the pixels PX of the pixel array 140 through the row lines RL.

In an embodiment, the row driver 130 may control the pixel PX to sense incident light for each row line unit. The row line unit may include at least one row line RL. For example, the row driver 130 may generate a transmission signal for controlling a transmission transistor, a reset control signal for controlling a reset transistor, and/or a selection control signal for controlling a selection transistor to provide the generated signals to the pixel array 140.

The readout circuit 150 may convert the analog pixel signal (or electrical signal) from the pixel PX connected to the row line RL selected from among the pixels PX, in response to the control signal from the timing generator 120, into a pixel value representing the amount of light.

The readout circuit 150 may convert the analog pixel signal output through the corresponding column line CL into a pixel value. For example, the readout circuit 150 may convert the analog pixel signal into the pixel value by comparing the ramp signal and the pixel signal. The pixel value may be and/or may include image data having bits. That is, the readout circuit 150 may include at least one of a selector, comparators, and counter circuits to convert the analog pixel signal into a pixel value.

The ramp signal generator 160 may generate reference signals and may transmit the reference signals to the readout circuit 150. The ramp signal generator 160 may include at least one of a current source, a resistor, and a capacitor to generate the reference signals. For example, the ramp signal generator 160 may adjust a ramp voltage applied to a ramp resistor by adjusting a current amount of a variable current source and/or resistance of a variable resistor, and may generate ramp signals that may fall and/or rise with a slope determined according to the current amount of the variable current source and/or the resistance of the variable resistor.

The data buffer 170 may store pixel values of the pixels PX connected to the selected column line CL transmitted from the readout circuit 150, and may output the stored pixel values (e.g., image signal IMS) in response to an enable signal from the controller 110.

The image signal processor 180 may perform image signal processing on the image signal IMS received from the data buffer 170. For example, the image signal processor 180 may receive image signals IMS from the data buffer 170, and may synthesize the received image signals to generate an image.

Figure 2:
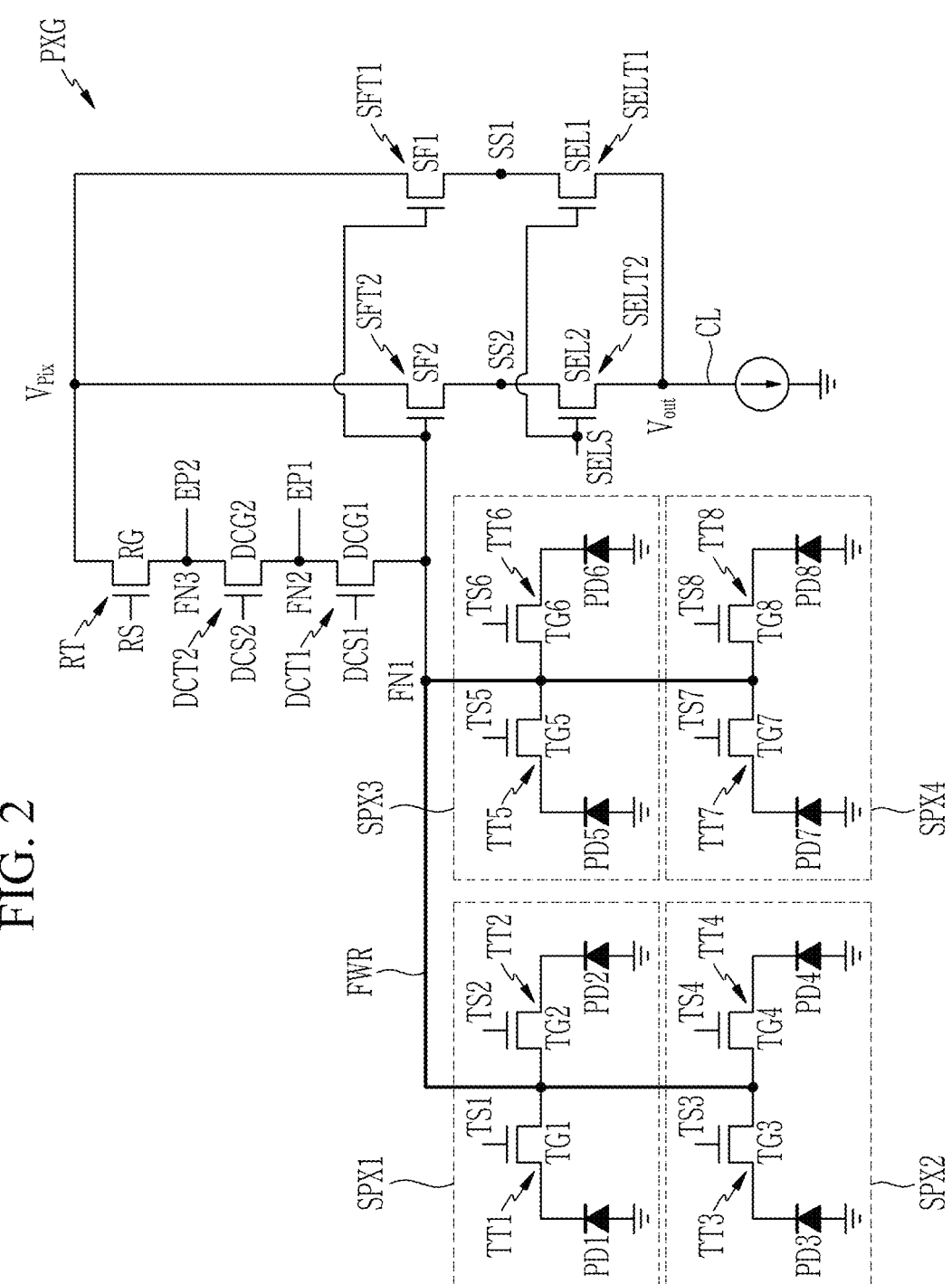
FIG. 2 shows a circuit diagram of a pixel group of an image sensor, according to an embodiment.

FIG. 2 shows a circuit diagram of a pixel group of an image sensor, according to an embodiment.

Referring to FIG. 2, pixel groups PXG of the image sensor 100 may include sub-pixel groups (e.g., a first sub-pixel group SPX1, a second sub-pixel group SPX2, a third sub-pixel group SPX3, and a fourth sub-pixel group SPX4), selection transistors (e.g., a first selection transistor SELT1 and a second selection transistor SELT2) connected to the first to fourth sub-pixel groups SPX1 to SPX4, and source follower transistors (e.g., a first source follower transistor SFT1 and a second source follower transistor SFT2) connected between the first to fourth sub-pixel groups SPX1 to SPX4 and the first and second selection transistors SELT1 and SELT2.

The first and second source follower transistors SFT1 and SFT2 may receive a same gate signal and a same pixel power source voltage. The first selection transistor SELT1 may be connected to the first source follower transistor SFT1 and the second selection transistor SELT2 may be connected to the second source follower transistor SFT2. Output terminals of the first selection transistor SELT1 and the second selection transistor SELT2 may be connected to each other.

The respective pixel groups PXG of the image sensor 100 may further include a reset transistor RT, a first conversion transistor DCT1, and a second conversion transistor DCT2.

The first sub-pixel group SPX1 may include a first photodiode PD1, a second photodiode PD2, and a first transmission transistor TT1 and a second transmission transistor TT2 that may be respectively connected to the first photodiode PD1 and the second photodiode PD2. The first photodiode PD1 and the second photodiode PD2 may respectively generate photocharges (hereinafter referred to as charges) corresponding to the received amount of light.

The first photodiode PD1 and the second photodiode PD2 may be respectively connected to the first transmission transistor TT1 and the second transmission transistor TT2. The first transmission transistor TT1 and the second transmission transistor TT2 of the first sub-pixel group SPX1 may be respectively turned on in response to active levels (e.g., logic high) of the transmission signals TS1 and TS2.

The first photodiode PD1 may be mainly described, and the description given below may be substantially equivalently applied to the remaining photodiodes (e.g., second photodiode PD2, third photodiode PD3, fourth photodiode PD4, fifth photodiode PD5, sixth photodiode PD6, seventh photodiode PD7, and eighth photodiode PD8) of the pixel groups PXG.

In an embodiment, the first photodiode PD1 may generate charges according to the receiving amount of light and may store the charges. The first photodiode PD1 may include an anode connected to a ground and a cathode connected to a first end of the first transmission transistor TT1. A first transmission signal TS1 may be supplied to a first transmission gate TG1 of the first transmission transistor TT1, and a first end of the first transmission transistor TT1 may be connected to a first floating diffusion region (e.g., a first floating diffusion region FD1 of FIG. 3).

When the first transmission transistor TT1 is turned on by the first transmission signal TS1, the charges stored in the first photodiode PD1 may be transmitted to the first floating diffusion region. The first floating diffusion region FD1 may maintain the charges transmitted from the first photodiode PD1.

The second sub-pixel group SPX2 may include the third photodiode PD3, the fourth photodiode PD4, and a third transmission transistor TT3 and a fourth transmission transistor TT4 that may be respectively connected to the third photodiode PD3 and the fourth photodiode PD4. The third transmission transistor TT3 and the fourth transmission transistor TT4 of the second sub-pixel group SPX2 may be respectively turned on in response to an active level (e.g., logic high) of the transmission signals TS3 and TS4.

The third sub-pixel group SPX3 may include the fifth photodiode PD5, the sixth photodiode PD6, and a fifth transmission transistor TT5 and a sixth transmission transistor TT6 that may be respectively connected to the fifth photodiode PD5 and the sixth photodiode PD6. The fifth transmission transistor TT5 and the sixth transmission transistor TT6 of the third sub-pixel group SPX3 may be respectively turned on in response to the active level (e.g., logic high) of the transmission signals TS5 and TS6.

The fourth sub-pixel group SPX4 may include the seventh photodiode PD7, the eighth photodiode PD8, and a seventh transmission transistor TT7 and an eighth transmission transistor TT8 respectively connected to the seventh photodiode PD7 and the eighth photodiode PD8. The seventh transmission transistor TT7 and the eighth transmission transistor TT8 of the fourth sub-pixel group SPX4 may be respectively turned on in response to the active level (e.g., logic high) of the transmission signals TS7 and TS8.

The transmission signals (e.g., the first transmission signal TS1, a second transmission signal TS2, a third transmission signal TS3, a fourth transmission signal TS4, fifth transmission signal TS5, a sixth transmission signal TS6, a seventh transmission signal TS7, and an eighth transmission signal TS8 may have the active level at the same time and/or different times, according to a reading mode.

For example, in a first reading mode, the first to eighth transmission signals TS1 to TS8 may be different from each other and may have the active level at different times. In a second reading mode (e.g., a charge summing mode), the first to eighth transmission signals TS1 to TS8 may be the same and/or substantially similar signals and may have the active level at the same and/or substantially similar time. In a third reading mode, the first and second transmission signals TS1 and TS2 of the first sub-pixel group SPX1 may be the same and/or substantially similar signals, the third and fourth transmission signals TS3 and TS4 of the second sub-pixel group SPX2 may be the same and/or substantially similar signals, the fifth and sixth transmission signals TS5 and TS6 of the third sub-pixel group SPX3 may be the same and/or substantially similar signals, and the seventh and eighth transmission signals TS7 and TS8 of the fourth sub-pixel group SPX4 may be the same and/or substantially similar signals. However, the present disclosure is not limited thereto, and the first to eighth transmission signals TS1 to TS8 may have different configurations according to the same and/or different reading modes.

The first to eighth transmission transistors TT1 to TT8 respectively provided to the first to fourth sub-pixel groups SPX1 to SPX4 may be turned on and may transmit the charges generated by the corresponding photodiode PD to the first floating diffusion node FN1.

Figure 3:
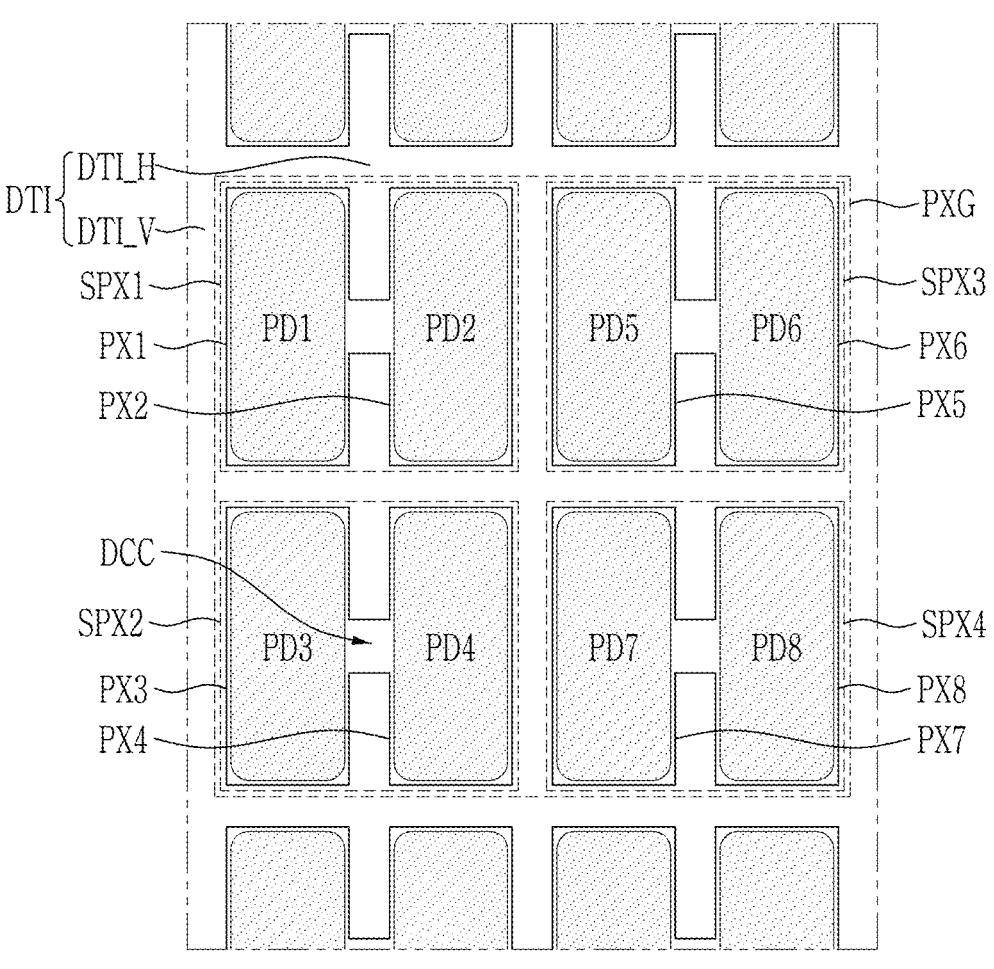
FIG. 3 shows a top plan view of a pixel group of an image sensor, according to an embodiment.
Figure 3:
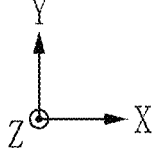

The first to fourth sub-pixel groups SPX1 to SPX4 may respectively include floating diffusion regions (e.g., a first floating diffusion region FD1, a second floating diffusion region FD2, a third floating diffusion region FD3, a fourth floating diffusion region FD4, a fifth floating diffusion region FD5, a sixth floating diffusion region FD6, a seventh floating diffusion region FD7, and an eighth floating diffusion region FD8 of FIG. 3). The first to eighth floating diffusion regions FD1 to FD8 may be electrically connected to each other through the floating connection wire FWR.

As shown in FIG. 2, the first to eighth photodiodes PD1 to PD8 may be connected to the first floating diffusion node FN1. Although FIG. 2 shows that eight photodiodes are connected to the first floating diffusion node FN1, it is to be understood that such configuration is shown by way of non-limiting example. That is, the number of the photodiodes PD connected to the first floating diffusion node FN1 may be modified in many ways without departing from the scope of the present disclosure.

The first conversion transistor DCT1 and the second conversion transistor DCT2 may be connected between the reset transistor RT and the first floating diffusion node FN1. The first conversion transistor DCT1 and the second conversion transistor DCT2 may respectively include a first conversion gate DCG1 and a second conversion gate DCG2 for respectively receiving a first conversion signal DCS1 and a second conversion signal DCS2.

The first conversion transistor DCT1 may be connected between the first floating diffusion node FN1 and a second floating diffusion node FN2. The first conversion transistor DCT1 may electrically connect the first floating diffusion node FN1 and the second floating diffusion node FN2 in response to the active level of the first conversion signal DCS1.

A first expanding metal pattern EP1 may be connected to the second floating diffusion node FN2. In an embodiment, the first expanding metal pattern EP1 may configure a capacitor with other wires.

The second conversion transistor DCT2 may be connected between the second floating diffusion node FN2 and a third floating diffusion node FN3. The second conversion transistor DCT2 may electrically connect the second floating diffusion node FN2 and the third floating diffusion node FN3 in response to the active level of the second conversion signal DCS2.

A second expanding metal pattern EP2 may be connected to the third floating diffusion node FN3. In an embodiment, the second expanding metal pattern EP2 may configure a capacitor with other wires.

The reset transistor RT may be connected between the third floating diffusion node FD3 and a pixel power source voltage wire $V_{Pix}$.

The first conversion transistor DCT1 may be coupled in series to the second conversion transistor DCT2 through the second floating diffusion node FN2, and the second conversion transistor DCT2 may be coupled in series to the reset transistor RT through the third floating diffusion node FN3.

As a result, the first conversion transistor DCT1, the second conversion transistor DCT2, and the reset transistor RT may be coupled in series.

The reset transistor RT may include a reset gate electrode RG for receiving a reset signal RS. The reset transistor RT may be turned on in response to the active level of the reset signal RS applied to the reset gate electrode RG, and may periodically and/or aperiodically reset the charges stored in the first floating diffusion node FN1, the second floating diffusion node FN2, and the third floating diffusion node FN3.

That is, when the reset transistor RT, the first conversion transistor DCT1, and the second conversion transistor DCT2 are turned on, the pixel power source voltage $V_{Pix}$ may be transmitted to the first floating diffusion node FN1, the second floating diffusion node FN2, and the third floating diffusion node FN3.

Accordingly, the charges stored in the first floating diffusion node FN1, the second floating diffusion node FN2, and the third floating diffusion node FN3 may be discharged, and the first floating diffusion node FN1, the second floating diffusion node FN2, and the third floating diffusion node FN3 may be reset.

The first conversion transistor DCT1 and the second conversion transistor DCT2 may respectively vary a conversion gain of the pixel group PXG by varying a capacitance of the first floating diffusion node FN1 in response to the active level of the first conversion signal DCS1 and the second conversion signal DCS2.

For example, when the images are photographed (e.g., captured), light with low intensity of illumination and high intensity of illumination may be concurrently input to the pixel group PXG, and/or strong light and weak light may be simultaneously input to the pixel group PXG. Accordingly, the conversion gains of the respective pixels may be variable by the incident light.

That is, the first conversion transistor DCT1 and the second conversion transistor DCT2 may be turned off and the pixel group PXG may have a first conversion gain, and the first conversion transistor DCT1 may be turned on and may have a second conversion gain that may be greater than the first conversion gain. Alternatively or additionally, the first conversion transistor DCT1 and the second conversion transistor DCT2 may be turned on and may have a third conversion gain that may be greater than the second conversion gain.

According to operations of the first conversion transistor DCT1 and the second conversion transistor DCT2, different conversion gains may be provided in the first conversion gain mode (e.g., high intensity of illumination mode) and the second to third conversion gain modes (e.g., low intensity of illumination modes).

That is, when the first conversion transistor DCT1 and the second conversion transistor DCT2 are turned on, a capacitance of the first floating diffusion node FN1, the second floating diffusion node FN2, and the third floating diffusion node FN3 may increase and the conversion gain may be reduced. Alternatively or additionally, when the first conversion transistor DCT1 and the second conversion transistor DCT2 are turned off, a capacitance of the first floating diffusion node FN1, the second floating diffusion node FN2, and the third floating diffusion node FN3 may be reduced and the conversion gain may increase.

The first source follower transistor SFT1 and the second source follower transistor SFT2 may respectively include a first source follower gate SF1 and a second source follower gate SF2, and the first source follower gate SF1 may be connected to the second source follower gate SF2 by one node. The first source follower gate SF1 and the second source follower gate SF2 may be connected to the first floating diffusion node FN1.

The first source follower transistor SFT1 and the second source follower transistor SFT2 may output an analog pixel signal according to a voltage at the first floating diffusion node FN1.

The pixel power source voltage $V_{Pix}$ may be applied to first ends of the first source follower transistor SFT1 and the second source follower transistor SFT2, and second ends of the first source follower transistor SFT1 and the second source follower transistor SFT2 may be connected to first ends of the first selection transistor SELT1 and the second selection transistor SELT2.

That is, the first source follower transistor SFT1 may include a first sharing source region SS1 sharing a source region with the first selection transistor SELT1 and a drain region connected to the pixel power source voltage $V_{Pix}$. The second source follower transistor SFT2 may include a second sharing source region SS2 sharing the source region with the second selection transistor SELT2 and a drain region connected to the pixel power source voltage $V_{Pix}$.

Hence, the first source follower transistor SFT1 may be connected to the first selection transistor SELT1 through the first sharing source region SS1, and the second source follower transistor SFT2 may be connected to the second selection transistor SELT2 through the second sharing source region SS2.

The first source follower transistor SFT1 and the second source follower transistor SFT2 may configure a source follower circuit, and may output a voltage at a level that may correspond to the charges stored in the first floating diffusion node FN1 as an analog pixel signal.

A first selection gate SEL1 of the first selection transistor SELT1 may be connected to a second selection gate SEL2 of the second selection transistor SELT2. Hence, the same selection signal SELS may be applied to the first selection gate SEL1 and the second selection gate SEL2.

A first end of the first selection transistor SELT1 may be connected to the first source follower transistor SFT1 through the first sharing source region SS1, and a second end of the first selection transistor SELT1 may be connected to an output voltage wire Vout for outputting pixel signals.

A first end of the second selection transistor SELT2 may be connected to the first source follower transistor SFT1 through the second sharing source region SS2, and a second end of the first selection transistor SELT1 may be connected to the output voltage wire Vout for outputting pixel signals.

When the first selection transistor SELT1 and the second selection transistor SELT2 are turned on by the selection signal SELS, the analog pixel signals from the first source follower transistor SFT1 and the second source follower transistor SFT2 may be transmitted to the readout circuit 150 of FIG. 1 through the column line CL.

Figure 4:
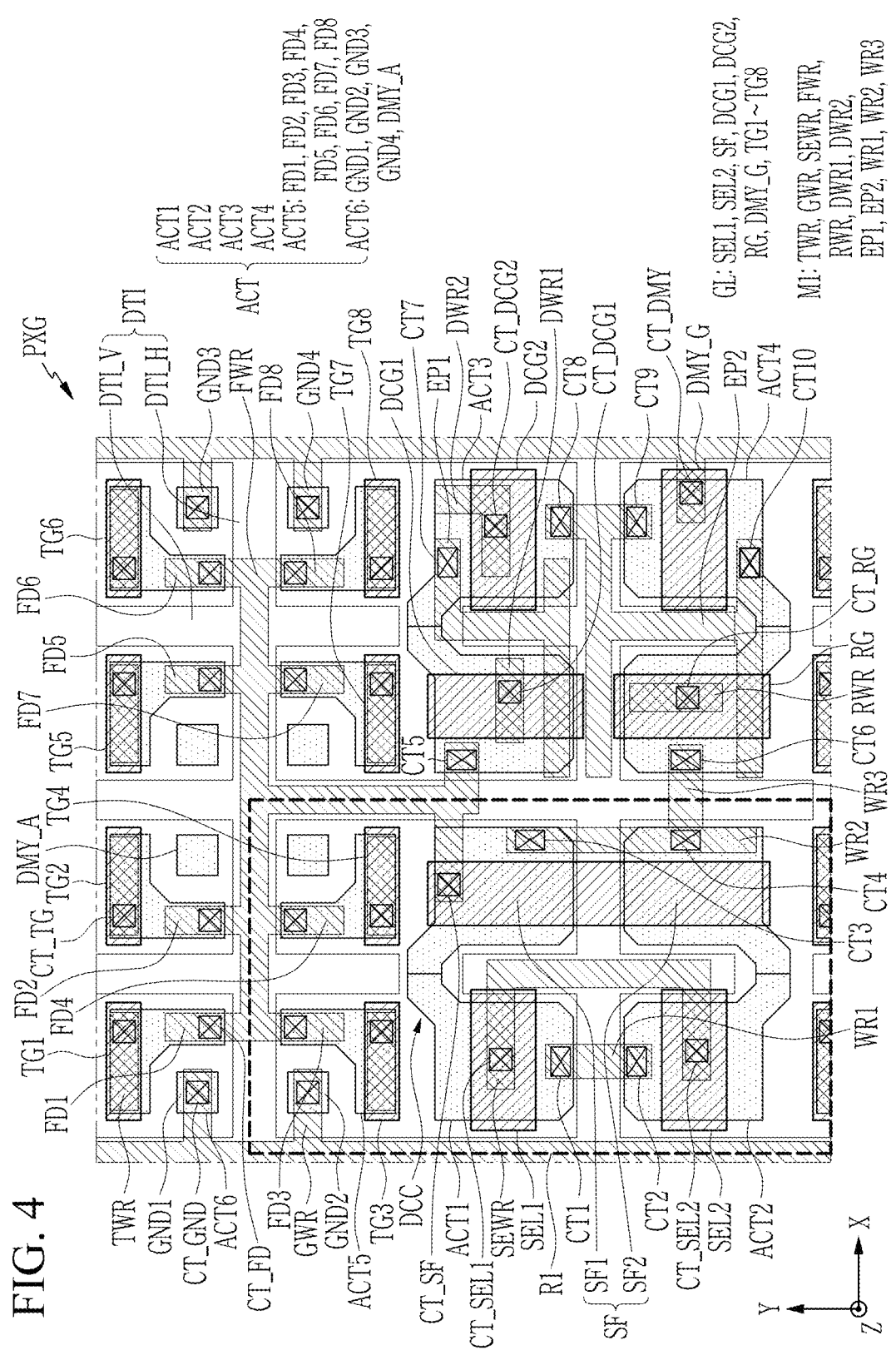
FIG. 4 shows a layout of a pixel group of an image sensor, according to an embodiment.
Figure 5:
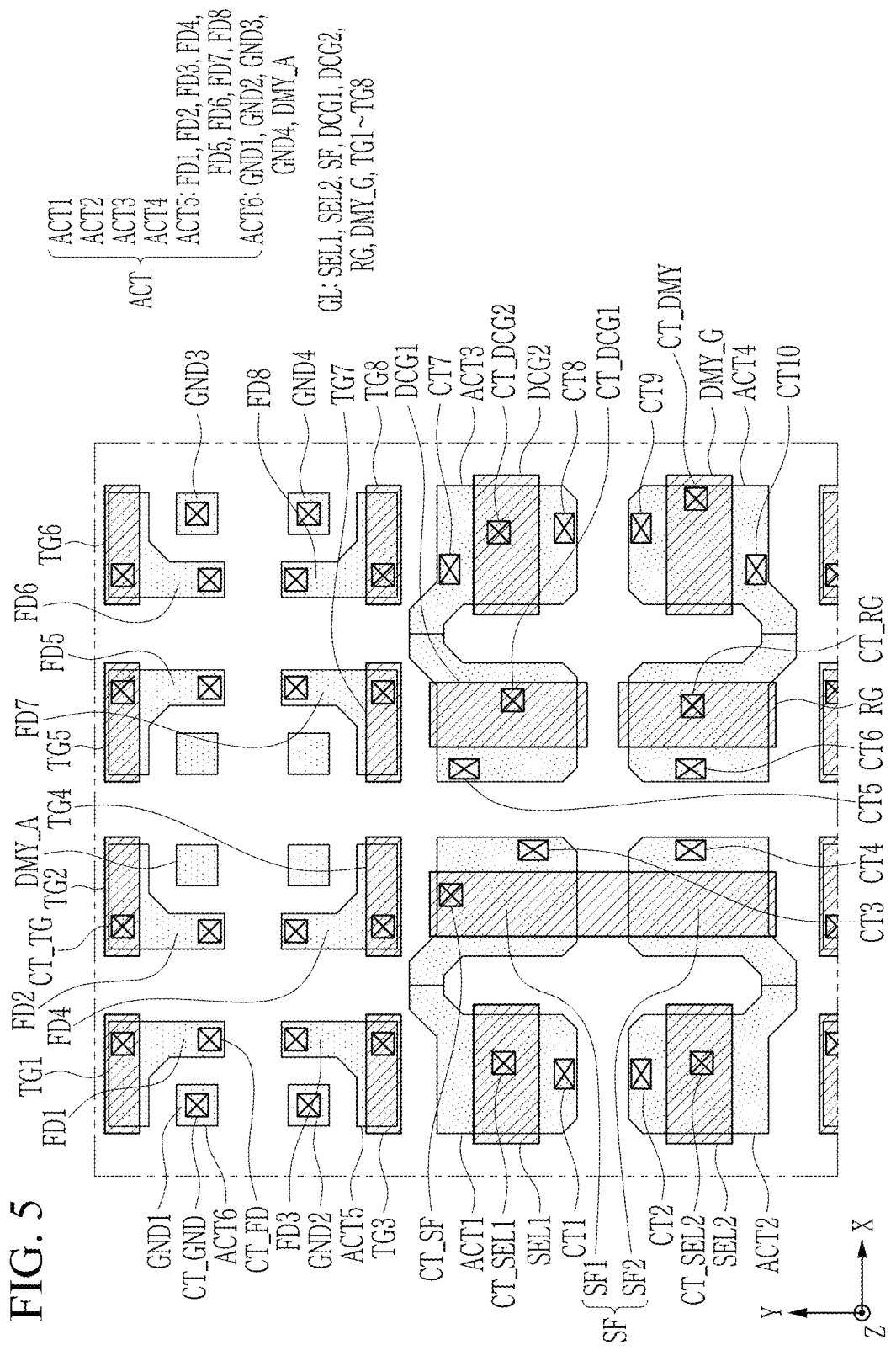
FIG. 5 shows a layout of an active pattern and a gate layer of FIG. 4, according to an embodiment.
Figure 6:
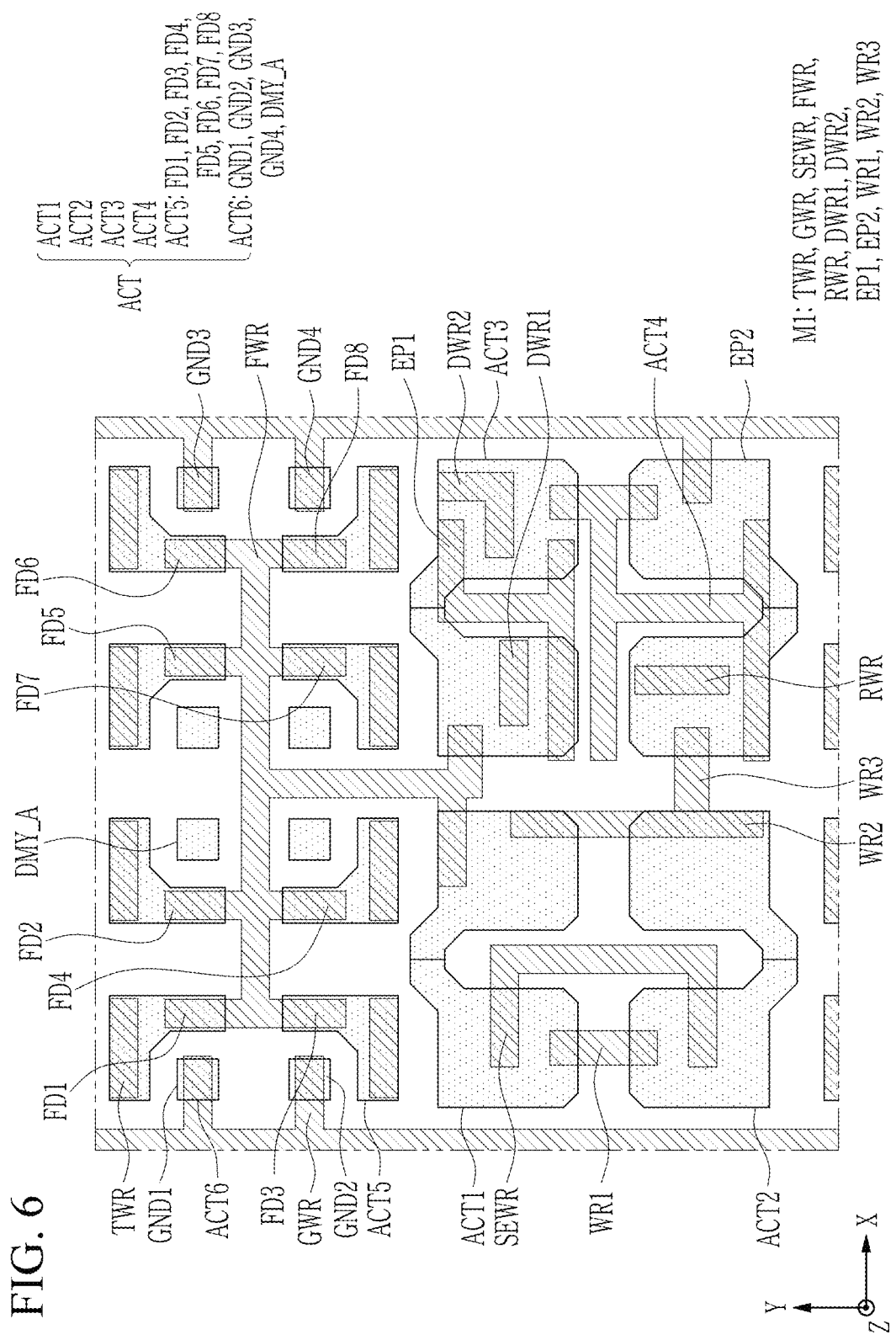
FIG. 6 shows a layout of an active pattern and a first metal layer of FIG. 4, according to an embodiment.

FIG. 3 shows a top plan view of a pixel group of an image sensor, according to an embodiment. FIG. 4 shows a layout of a pixel group of an image sensor, according to an embodiment. FIG. 5 shows a layout of an active pattern and a gate layer of FIG. 4, according to an embodiment. FIG. 6 shows a layout of an active pattern and a first metal layer of FIG. 4, according to an embodiment.

Referring to FIG. 3 to FIG. 6, the pixel group PXG may include first to fourth sub-pixel groups SPX1 to SPX4, first to eighth photodiodes PD1 to PD8, an active pattern ACT, a gate layer GL, and a first metal layer M1.

The active pattern ACT may be disposed on the first to eighth photodiodes PD1 to PD8, and may include active patterns (e.g., a first active pattern ACT1, a second active pattern ACT2, a third active pattern ACT3, a fourth active pattern ACT4, a fifth active pattern ACT5, and a sixth pattern ACT6). The first to sixth active pattern may be disposed on the same layer.

The gate layer GL may be disposed on the active pattern ACT and may include a first selection gate SEL1, a second selection gate SEL2, a source follower gate SF, a first conversion gate DCG1, a second conversion gate DCG2, a dummy gate DMY_G, and first to eighth transmission gates (e.g., the first transmission gate TG1, a second transmission gate TG2, a third transmission gate TG3, a fourth transmission gate TG4, a fifth transmission gate TG5, a sixth transmission gate TG6, a seventh transmission gate TG7, and an eighth transmission gate TG8). The first to eighth transmission gates may be disposed on the same and/or a substantially similar layer.

The first metal layer M1 may be disposed on the gate layer GL and may include a transmission gate wire TWR, a ground wire GWR, a floating connection wire FWR, a first expanding metal pattern EP1, a second expanding metal pattern EP2, a first conversion gate wire DWR1, a second conversion gate wire DWR2, a selection gate connection wire SEWR, a reset gate wire RWR, and connection wires (e.g., a first connection wire WR1, a second connection wire WR2, and a third connection wire WR3). The first to third connection wires may be disposed on the same and/or a substantially similar layer.

The first to fourth sub-pixel groups SPX1 to SPX4 may be arranged in a two-dimensional way in a first direction X and a second direction Y on a plane. That is, the first to fourth sub-pixel groups SPX1 to SPX4 may be arranged in a matrix form.

For example, as shown in FIG. 3, the first sub-pixel group SPX1 and the third sub-pixel group SPX3 may be arranged in the first direction X, and the first sub-pixel group SPX1 and the second sub-pixel group SPX2 may be arranged in the second direction Y.

The fourth sub-pixel group SPX4 may be arranged in the second direction Y with the third sub-pixel group SPX3, and may be arranged in the first direction X with the second sub-pixel group SPX2. That is, the first sub-pixel group SPX1 and the fourth sub-pixel group SPX4 may be arranged in the diagonal direction. However, an arrangement form of the first to fourth sub-pixel groups SPX1 to SPX4 is not limited thereto, and may be changed in many ways without departing from the scope of the present disclosure.

The first to fourth sub-pixel groups SPX1 to SPX4 may include pixels (e.g., a first pixel PX1, a second pixel PX2, a third pixel PX3, a fourth pixel PX4, a fifth pixel PX5, a sixth pixel PX6, a seventh pixel PX7, and an eighth pixel PX8) arranged in columns and rows.

For example, the first sub-pixel group SPX1 may include the first pixel PX1 and the second pixel PX2 arranged in the first direction X, the second sub-pixel group SPX2 may include the third pixel PX3 and the fourth pixel PX4 arranged in the first direction X, the third sub-pixel group SPX3 may include the fifth pixel PX5 and the sixth pixel PX6 arranged in the first direction X, and the fourth sub-pixel group SPX4 may include the seventh pixel PX7 and the eighth pixel PX8 arranged in the first direction X.

The first sub-pixel group SPX1 may include the first photodiode PD1, the second photodiode PD2, the first transmission gate TG1, the second transmission gate TG2, the first floating diffusion region FD1, and the second floating diffusion region FD2.

The second sub-pixel group SPX2 may include the third photodiode PD3, the fourth photodiode PD4, the third transmission gate TG3, the fourth transmission gate TG4, the third floating diffusion region FD3, and the fourth floating diffusion region FD4.

The third sub-pixel group SPX3 may include the fourth photodiode PD4, the fifth photodiode PD5, the fourth transmission gate TG4, the fifth transmission gate TG5, the fifth floating diffusion region FD5, and the sixth floating diffusion region FD6.

The fourth sub-pixel group SPX4 may include the seventh photodiode PD7, an eighth photodiode PD8, the seventh transmission gate TG7, the eighth transmission gate TG8, seventh floating diffusion region FD7, and the eighth floating diffusion region FD8.

The first to eighth photodiodes PD1 to PD8 may be divided and disposed in the first direction X in the first to fourth sub-pixel groups SPX1 to SPX4.

For example, the third photodiode PD3 and the fourth photodiode PD4 may be divided and disposed in the first direction X in the second sub-pixel group SPX2. That is, the third photodiode PD3 and the fourth photodiode PD4 may be spaced and disposed in the first direction X.

The third photodiode PD3 and the fourth photodiode PD4 have been described as a reference, and the remaining photodiodes (e.g., PD1, PD2, PD5, PD6, PD7, and PD8) may have the same and/or a substantially similar arrangement form as the arrangement relationship of the third photodiode PD3 and the fourth photodiode PD4 in the sub-pixel groups SPX1, SPX3, and SPX4.

The first to eighth photodiodes PD1 to PD8 may respectively include two short sides extending in the first direction X and two long sides extending in the second direction Y, and may respectively have a rectangular shape in a plan view. However, the respective shapes of the first to eighth photodiodes PD1 to PD8 on the plane may not be limited thereto and may be modifiable in many ways without departing from the scope of the present disclosure.

The pixel separating pattern DTI may be disposed between the photodiodes PD. The pixel separating pattern DTI may have a lattice shape in a plan view, may be disposed between the photodiodes PD, and may define the first to fourth sub-pixel groups SPX1 to SPX4.

That is, the pixel separating pattern DTI may include a horizontal pixel separating pattern DTI_H extending in the first direction X and a vertical pixel separating pattern DTI_V extending in the second direction Y crossing the first direction X. As the horizontal pixel separating pattern DTI_H and the vertical pixel separating pattern DTI_V are disposed between the photodiodes PD, the pixel separating pattern DTI may define lateral sides of the respective short sides and long sides of the photodiodes PD and may have a lattice shape in a plan view.

A portion of the pixel separating pattern DTI may be separated and disposed in the second direction Y. That is, a portion of the pixel separating pattern DTI may be separated and disposed in the second direction Y among the photodiodes PD.

For example, a first part of the vertical pixel separating pattern DTI_V from among the pixel separating pattern DTI may be spaced in the second direction Y, among the photodiodes PD, from a second part of the vertical pixel separating pattern DTI_V, such that a separating region DCC may be defined between the first part and the second part of the vertical pixel separating pattern DTI_V. However, without being limited thereto, a first part of the horizontal pixel separating pattern DTI_H may be separated in the first direction X, among the photodiodes PD, from a second part of the horizontal pixel separating pattern DTI_H, such that the separating region DCC may be defined between the first part and the second part of the horizontal pixel separating pattern DTI_H.

The separating region DCC may be disposed among the photodiodes PD. In an embodiment, the separating region DCC may be substantially disposed in a center of the respective first to fourth sub-pixel groups SPX1 to SPX4. That is, the separating region DCC may be disposed in parallel to a center of the photodiodes PD in the first direction X among the photodiodes PD disposed in the respective first to fourth sub-pixel groups SPX1 to SPX4. In other words, the separating region DCC may be disposed in a center of a border among the photodiodes PD.

For example, the separating region DCC may be substantially disposed in the center of the first sub-pixel group SPX1. The separating region DCC may be disposed in parallel to the centers of the first photodiode PD1 and the second photodiode PD2 in the first direction X. However, the position (location) of the separating region DCC is not limited thereto, and may be changed in many ways without departing from the scope of the present disclosure.

In some embodiments, the separating region DCC may be disposed on a portion that is not the center in the first to fourth sub-pixel groups SPX1 to SPX4. In some embodiments, some of the separating regions DCC may be substantially disposed in the respective centers of the first to fourth sub-pixel groups SPX1 to SPX4, and others thereof may be disposed in other portions, that are not the centers, of the first to fourth sub-pixel groups SPX1 to SPX4.

The first pixel PX1 and the second pixel PX2 of the first sub-pixel group SPX1 may respectively include one photodiode and one transmission gate.

For example, the first pixel PX1 of the first sub-pixel group SPX1 may include the first photodiode PD1 and the first transmission gate TG1. The second pixel PX2 may include the second photodiode PD2 and the second transmission gate TG2.

The third pixel PX3 of the second sub-pixel group SPX2 may include the third photodiode PD3 and the third transmission gate TG3. The fourth pixel PX4 may include the fourth photodiode PD4 and the fourth transmission gate TG4.

The fifth pixel PX5 of the third sub-pixel group SPX3 may include the fifth photodiode PD5 and the fifth transmission gate TG5. The sixth pixel PX6 may include the sixth photodiode PD6 and the sixth transmission gate TG6.

The seventh pixel PX7 of the fourth sub-pixel group SPX4 may include the seventh photodiode PD7 and the seventh transmission gate TG7. The eighth pixel PX8 may include the eighth photodiode PD8 and the eighth transmission gate TG8.

The first to eighth transmission gates TG1 to TG8 may be respective gates of the first to eighth transmission transistors (e.g., first to eighth transmission transistors TT1 to TT8 of FIG. 2). The first to eighth transmission transistors TT1 to TT8 may be respectively connected to the first to eighth photodiodes PD1 to PD8.

The active pattern ACT may be disposed on the photodiodes PD, and may overlap the photodiodes PD in the third direction Z.

For example, the first active pattern ACT1 may be disposed on some of the first to fourth sub-pixel groups SPX1 to SPX4. As another example, the first active pattern ACT1 may be disposed in the second sub-pixel group SPX2.

The first active pattern ACT1 may overlap at least some of the photodiodes PD. That is, a portion of the first active pattern ACT1 may overlap the photodiodes PD in the third direction Z, and the remaining portion of the first active pattern ACT1 may not overlap the photodiodes PD and may be disposed in the separating region DCC defined by the vertical pixel separating pattern DTI_V separated in the second direction Y.

The first active pattern ACT1 overlapping the photodiodes PD and the first active pattern ACT1 disposed in the separating region DCC may be integrally formed.

For example, a portion of the first active pattern ACT1 disposed on one side of the separating region DCC in the first direction X may overlap the third photodiode PD3 in the third direction Z, and a portion of the first active pattern ACT1 disposed on the other side of the separating region DCC in the first direction X may overlap the fourth photodiode PD4 in the third direction Z.

A portion of the first active pattern ACT1 disposed in separating region DCC may not overlap the third photodiode PD3 and the fourth photodiode PD4. Hence, a portion of the first active pattern ACT1 may be substantially disposed in the center of the second sub-pixel group SPX2.

The second active pattern ACT2 may be disposed in some of the first to fourth sub-pixel groups SPX1 to SPX4. For example, the second active pattern ACT2 may overlap the first sub-pixel group SPX1 of another pixel group PXG.

The second active pattern ACT2 may be spaced from the first active pattern ACT1 in the second direction Y with the horizontal pixel separating pattern DTI_H therebetween. That is, the first active pattern ACT1 and the second active pattern ACT2 may have a symmetric shape in the second direction Y with the horizontal pixel separating pattern DTI_H therebetween.

The second active pattern ACT2 may overlap at least some of the photodiodes PD. That is, a portion of the second active pattern ACT2 may overlap the photodiodes PD in the third direction Z, and another portion of the second active pattern ACT2 may not overlap the photodiodes PD and may be disposed in the separating region DCC defined by the vertical pixel separating pattern DTI_V separated and disposed in the second direction Y.

The second active pattern ACT2 overlapping the photodiodes PD and the second active pattern ACT2 disposed in the separating region DCC may be integrally formed.

For example, a portion of the second active pattern ACT2 disposed on the one side of the separating region DCC in the first direction X may overlap the first photodiode PD1 in the third direction Z, and a portion of the second active pattern ACT2 disposed on the other side of the separating region DCC in the first direction X may overlap the second photodiode PD2 in the third direction Z.

A portion of the second active pattern AC2 disposed in separating region DCC may not overlap the first photodiode PD1 and the second photodiode PD2. Hence, a portion of the second active pattern ACT2 may be substantially disposed in the center of the first sub-pixel group SPX1.

The first selection gate SEL1 may be disposed in the first active pattern ACT1. The first selection gate SEL1 may be a gate of the first selection transistor (e.g., first selection transistor SELT1 of FIG. 2). The first selection gate SEL1 may be disposed on the first active pattern ACT1, and may configure the first selection transistor SELT1 with an extrinsic region doped to the first active pattern ACT1.

The first selection gate SEL1 may overlap a portion of the first active pattern ACT1 disposed on the one side of the separating region DCC in the first direction X, in the third direction Z.

For example, the first selection gate SEL1 may be disposed on the first active pattern ACT1 overlapping the third photodiode PD3 in the third sub-pixel group SPX2.

The second selection gate SEL2 may be disposed on the second active pattern ACT2. The second selection gate SEL2 may be a gate of the second selection transistor (e.g., second selection transistor SELT2 of FIG. 2). The second selection gate SEL2 may be disposed on the second active pattern ACT2, and may configure the second selection transistor SELT2 with an extrinsic region doped to the second active pattern ACT2.

The second selection gate SEL2 may overlap a portion of the second active pattern ACT2 disposed on the one side of the separating region DCC in the first direction X, in the third direction Z. The second selection gate SEL2 may be spaced from the first selection gate SEL1 in the second direction Y with the horizontal pixel separating pattern DTI_H therebetween. That is, the second selection gate SEL2 may be disposed to be symmetric with the first selection gate SEL1 with the horizontal pixel separating pattern DTI_H therebetween.

For example, the second selection gate SEL2 may be disposed in the second active pattern ACT2 overlapping the first photodiode PD1 on the first sub-pixel group SPX1.

A source follower gate SF may be disposed on the first active pattern ACT1 and the second active pattern ACT2. That is, the source follower gate SF may extend in the second direction Y to reach the second active pattern ACT2 from the first active pattern ACT1.

The source follower gate SF may cross the horizontal pixel separating pattern DTI_H, and may extend in the second direction Y to the second active pattern ACT2 from the first active pattern ACT1. Accordingly, at least a portion of the source follower gate SF may be disposed on the horizontal pixel separating pattern DTI_H, and may overlap the horizontal pixel separating pattern DTI_H in the third direction Z.

The source follower gate SF may include a first source follower gate SF1 disposed on the first active pattern ACT1 and a second source follower gate SF2 disposed on the second active pattern ACT2. That is, the first source follower gate SF1 and the second source follower gate SF2 may be integrally formed.

The first source follower gate SF1 and the second source follower gate SF2 may respectively be gates of the first source follower transistor (e.g., first source follower transistor SFT1 of FIG. 2) and the second source follower transistor (e.g., second source follower transistor SFT2 of FIG. 2).

The first source follower gate SF1 may be disposed on the first active pattern ACT1, and may configured the first source follower transistor SFT1 with an extrinsic region doped to the first active pattern ACT1. The second source follower gate SF2 may be disposed on the second active pattern ACT2, and may configure the first source follower transistor SFT1 with an extrinsic region doped to the second active pattern ACT2.

The first source follower gate SF1 may overlap a portion of the first active pattern ACT1 disposed on the other side of the separating region DCC in the first direction X, in the third direction Z. That is, the first source follower gate SF1 may be spaced from the first selection gate SEL1 in the first direction X with the vertical pixel separating pattern DTI_V therebetween.

For example, the first source follower gate SF1 may be disposed on the first active pattern ACT1 overlapping the fourth photodiode PD4 in the third sub-pixel group SPX3.

Accordingly, the first source follower transistor SFT1 may be connected to the first selection transistor SELT1 through the first active pattern ACT1.

The second source follower gate SF2 may overlap a portion of the second active pattern ACT2 disposed on the other side of the separating region DCC in first direction X, in the third direction Z. That is, the second source follower gate SF2 may be spaced from the second selection gate SEL2 in the first direction X with the vertical pixel separating pattern DTI_V therebetween.

For example, the second source follower gate SF2 may be disposed on the second active pattern ACT2 overlapping the second photodiode PD2 in the first sub-pixel group SPX1.

Hence, the second source follower transistor SFT2 may be connected to the second selection transistor SELT2 through the second active pattern ACT2.

The first selection gate SEL1 may be connected to the second selection gate SEL2 through the selection gate connection wire SEWR. One side end of the selection gate connection wire SEWR may be connected to the first selection gate SEL1 through the first selection gate contact CT_SEL1. The first selection gate contact CT_SEL1 may overlap the center of the first selection gate SEL1, but is not limited thereto.

The other side end of the selection gate connection wire SEWR may be connected to the second selection gate SEL2 through the second selection gate contact CT_SEL2. The second selection gate contact CT_SEL2 may overlap the center of the second selection gate SEL2, but is not limited thereto.

A portion of the selection gate connection wire SEWR may be disposed on the first selection gate SEL1 and the second selection gate SEL2 and may extend in the first direction X. Another portion of the selection gate connection wire SEWR may extend in the second direction Y on the pixel separating pattern DTI.

The first connection wire WR1 may extend in the second direction Y to reach the second active pattern ACT2 from the first active pattern ACT1 and may connect the first active pattern ACT1 and the second active pattern ACT2. That is, the first connection wire WR1 may be connected to a portion of the first active pattern ACT1 disposed on one side of the first selection gate SEL1 through a first contact CT1, and the first connection wire WR1 may be connected to a portion of the second active pattern ACT2 disposed on one side of the second selection gate SEL2 through a second contact CT2.

The second connection wire WR2 may extend in the second direction Y to reach the second active pattern ACT2 from the first active pattern ACT1 and may connect the first active pattern ACT1 and the second active pattern ACT2.

That is, the second connection wire WR2 may be connected to a portion of the first active pattern ACT1 disposed on one side of the active pattern first source follower gate SF1 through the third contact CT3, and the active pattern second connection wire WR2 may be connected to a portion of the second active pattern ACT2 disposed on one side of the second source follower gate SF2 through the fourth contact CT4.

A relationship between the first source follower transistor SFT1 and the first selection transistor SELT1 and a relationship between the second source follower transistor SFT2 and the second selection transistor SELT2 are described with reference to FIG. 7A to FIG. 7C.

The third active pattern ACT3 may be spaced from the first active pattern ACT1 in the first direction X with the vertical pixel separating pattern DTI_V therebetween. That is, the first active pattern ACT1 and the third active pattern ACT3 may have symmetric shapes in the first direction X with the vertical pixel separating pattern DTI_V therebetween.

Hence, a disposing relationship between the third active pattern ACT3 and other elements may be substantially equivalent to the disposing relationship between the first active pattern ACT1 and other elements. Consequently, repeated descriptions may be omitted and differences may be described.

The third active pattern ACT3 may be disposed in some of the first to fourth sub-pixel groups SPX1 to SPX4.

For example, the third active pattern ACT3 may be disposed in the fourth sub-pixel group SPX4. A portion of the third active pattern ACT3 disposed on the one side of the separating region DCC in the first direction X may overlap the seventh photodiode PD7 in the third direction Z, and a portion of the third active pattern ACT3 disposed on the other side of the separating region DCC in the first direction X may overlap the eighth photodiode PD8 in the third direction Z.

The portion of the third active pattern ACT3 disposed in the separating region DCC may not overlap the seventh photodiode PD7 and the eighth photodiode PD8. Hence, the portion of the third active pattern ACT3 may be substantially disposed in the center of the fourth sub-pixel group SPX4.

The first conversion gate DCG1 and the second conversion gate DCG2 may be disposed on the third active pattern ACT3. The first conversion gate DCG1 and the second conversion gate DCG2 may be gates of the first conversion transistor (e.g., first conversion transistor DCT1 of FIG. 2) and the second conversion transistor (e.g., second conversion transistor DCT2 of FIG. 2).

The first conversion gate DCG1 may be disposed on the third active pattern ACT3, and may configure the first conversion transistor DCT1 with an extrinsic region doped to the third active pattern ACT3.

The second conversion gate DCG2 may be spaced from the first conversion gate DCG1 on the third active pattern ACT3, and may configure the second conversion transistor DCT2 with an extrinsic region doped to the third active pattern ACT3.

Hence, the first conversion transistor DCT1 may be connected to the second conversion transistor DCT2 through the third active pattern ACT3 disposed in the separating region DCC. That is, the first conversion transistor DCT1 may be connected to the second conversion transistor DCT2 through the third active pattern ACT3 passing through the separating region DCC from the one side of the first conversion gate DCG1 and extending to one side of the second conversion gate DCG2.

An elongation direction of the first conversion gate DCG1 may be different from an elongation direction of the second conversion gate DCG2. For example, the first conversion gate DCG1 may extend in the first direction X, and the second conversion gate DCG2 may extend in the second direction Y. However, the elongation directions of the first conversion gate DCG1 and the second conversion gate DCG2 are not limited thereto, and may be variable in many ways without departing from the scope of the present disclosure. For example, the first conversion gate DCG1 and the second conversion gate DCG2 may extend substantially in the same direction. That is, the first conversion gate DCG1 and the second conversion gate DCG2 may extend in the first direction X crossing the elongation direction of the source follower gate SF, and/or the first conversion gate DCG1 and the second conversion gate DCG2 may extend in the second direction Y that is the elongation direction of the source follower gate SF.

As another example, the first conversion gate DCG1 may extend in the first direction X crossing the second direction Y that is the elongation direction of the source follower gate SF, and the second conversion gate DCG2 may extend in the second direction Y that is the elongation direction of the source follower gate SF.

The fourth active pattern ACT4 may be spaced from the second active pattern ACT2 in the first direction X with the vertical pixel separating pattern DTI_V therebetween. That is, the second active pattern ACT2 and the fourth active pattern ACT4 may have symmetric shapes in the first direction X with the vertical pixel separating pattern DTI_V therebetween.

Hence, a disposing relationship between the fourth active pattern ACT4 and other elements may be substantially equivalent to a disposing relationship between the second active pattern ACT2 and other elements. Consequently, repeated descriptions may be omitted and differences may be mainly described.

The fourth active pattern ACT4 may overlap some of the first to fourth sub-pixel groups SPX1 to SPX4.

For example, the fourth active pattern ACT4 may be disposed in the third sub-pixel group SPX3. A portion of the fourth active pattern ACT4 disposed on the one side of the separating region DCC in the first direction X may overlap the fifth photodiode PD5 in the third direction Z, and a portion of the fourth active pattern ACT4 disposed on the other side of the separating region DCC in the first direction X may overlap the sixth photodiode PD6 in the third direction Z.

The portion of the fourth active pattern ACT4 disposed in the separating region DCC may not overlap the fifth photodiode PD5 and the sixth photodiode PD6. Hence, the portion of the fourth active pattern ACT4 may be substantially disposed in the center of the third sub-pixel group SPX4.

The reset gate RG and the dummy gate DMY_G may be disposed on the fourth active pattern ACT4. The reset gate RG may be a gate of the reset transistor (e.g., reset transistor RT of FIG. 2). The reset gate RG may be disposed on the fourth active pattern ACT4, and may configure the reset transistor RT with an extrinsic region doped to the fourth active pattern ACT4.

The dummy gate DMY_G may be spaced from the reset gate RG on the fourth active pattern ACT4. That is, the dummy gate DMY_G may be spaced in the first direction X with the vertical pixel separating pattern DTI_V therebetween.

The elongation directions of the reset gate RG and the dummy gate DMY_G may be different from each other. For example, the dummy gate DMY_G may extend in the first direction X, and the reset gate RG may extend in the second direction Y. However, the elongation directions of the reset gate RG and the dummy gate DMY_G are not limited and may be changeable in many ways without departing from the scope of the present disclosure. For example, the reset gate RG and the dummy gate DMY_G may extend in substantially the same direction. That is, the reset gate RG and the dummy gate DMY_G may respectively extend in the first direction X crossing the elongation direction of the source follower gate SF, or may respectively extend in the second direction Y that is the elongation direction of the source follower gate SF.

For another example, the reset gate RG may extend in the first direction X crossing the second direction Y that is the elongation direction of the source follower gate SF, and the dummy gate DMY_G may extend in the second direction Y that is the elongation direction of the source follower gate SF.

The reset gate RG may be disposed to be symmetric with the first conversion gate DCG1 in the second direction Y with the horizontal pixel separating pattern DTI_H therebetween. The dummy gate DMY_G may be disposed to be symmetric with the second conversion gate DCG2 in the second direction Y with the horizontal pixel separating pattern DTI_H therebetween.

The first conversion gate wire DWR1 may be disposed on the first conversion gate DCG1. The first conversion gate wire DWR1 may be connected to the first conversion gate DCG1 through a first conversion gate contact CT_DCG1. The first conversion gate contact CT_DCG1 may overlap the center of the first conversion gate DCG1, but is not limited thereto.

The second conversion gate wire DWR2 may be disposed on the second conversion gate DCG2. The second conversion gate wire DWR2 may be connected to the second conversion gate DCG2 through a second conversion gate contact CT_DCG2. The second conversion gate contact CT_DCG2 may overlap the center of the second conversion gate DCG2, but the present disclosure is not limited thereto.

The first expanding metal pattern EP1 may be disposed on the third active pattern ACT3. The first expanding metal pattern EP1 may overlap at least some of the first conversion gate DCG1, the pixel separating pattern DTI, and the third active pattern ACT3 in the third direction Z.

The first expanding metal pattern EP1 may be connected to the third active pattern ACT3. That is, the first expanding metal pattern EP1 may be connected to a portion of the third active pattern ACT3 disposed on the one side of the second conversion gate DCG2 through the seventh contact CT7.

The first expanding metal pattern EP1 may be connected to the second floating diffusion node (e.g., second floating diffusion node FN2 of FIG. 2) disposed between the first conversion transistor (e.g., first conversion transistor DCT1 of FIG. 2) and the second conversion transistor (e.g., second conversion transistor DCT2 of FIG. 2). Hence, the first expanding metal pattern EP1 may configure a capacitor with other metal lines.

The ground wire GWR may be connected to the dummy gate DMY_G in the fourth active pattern ACT4. That is, the ground wire GWR may be connected to the dummy gate DMY_G through a dummy gate contact CT_DMY.

The reset gate wire RWR may be disposed on the reset gate RG. The reset gate wire RWR may be connected to the reset gate RG through the reset gate contact CT_RG in the fourth active pattern ACT4.

The second expanding metal pattern EP2 may be disposed on the fourth active pattern ACT4. The second expanding metal pattern EP2 may overlap at least some of the reset gate RG, the pixel separating pattern DTI, and the fourth active pattern ACT4 in the third direction Z.

The second expanding metal pattern EP2 may be connected to the third active pattern ACT3 and the fourth active pattern ACT4. That is, the second expanding metal pattern EP2 may be connected to a portion of the third active pattern ACT3 disposed on the other side of the second conversion gate DCG2 through the eighth contact CT8.

The second expanding metal pattern EP2 may be connected to a portion of the fourth active pattern ACT4 disposed on one side of the dummy gate DMY_G through the ninth contact CT9, and the second expanding metal pattern EP2 may be connected to a portion of the fourth active pattern ACT4 disposed on the other side of the dummy gate DMY_G through the tenth contact CT10.

The second expanding metal pattern EP2 may connect the second conversion transistor (e.g., second conversion transistor DCT2 of FIG. 2) and the reset transistor (e.g., reset transistor RT of FIG. 2). Further, the second expanding metal pattern EP2 may be connected to a third floating diffusion node (e.g., third floating diffusion node FN3 of FIG. 2) disposed between the second conversion transistor DCT2 and the reset transistor RT.

Hence, the second expanding metal pattern EP2 may configure a capacitor with other metal lines similarly to the first expanding metal pattern EP1.

The third connection wire WR3 may extend in the first direction X to reach the second active pattern ACT2 from the fourth active pattern ACT4. The third connection wire WR3 may be disposed on the second active pattern ACT2, the fourth active pattern ACT4, and the pixel separating pattern DTI.

The third connection wire WR3 may be connected to the fourth active pattern ACT4 through the sixth contact CT6. That is, the fourth active pattern ACT4 may be connected to the second connection wire WR2 through the third connection wire WR3. The second connection wire WR2 and the third connection wire WR3 may be integrally formed.

A first end of the reset transistor (e.g., reset transistor RT of FIG. 2) may be connected to the output voltage wire Vout through the third connection wire WR3 connected to the second connection wire WR2.

The pixel group PXG may include fifth active patterns ACT5.

The fifth active patterns ACT5 may be respectively disposed on the first to fourth sub-pixel groups SPX1 to SPX4. For example, two fifth active patterns ACT5 may be disposed on the respective first to fourth sub-pixel groups SPX1 to SPX4.

The fifth active patterns ACT5 disposed in the same sub-pixel group from among the first to fourth sub-pixel groups SPX1 to SPX4 may be spaced from the first active pattern ACT1 or the third active pattern ACT3 in the second direction Y.

The fifth active patterns ACT5 disposed in different sub-pixel groups from among the first to fourth sub-pixel groups SPX1 to SPX4 may be spaced in the second direction Y and may be symmetrically disposed with the horizontal pixel separating pattern DTI_H therebetween.

The fifth active patterns ACT5 disposed in the respective first to fourth sub-pixel groups SPX1 to SPX4 may be spaced in the first direction X and may be symmetrically disposed with the vertical pixel separating pattern DTI_V therebetween.

For example, the fifth active patterns ACT5 disposed in the second sub-pixel group SPX2 may be spaced from the first active pattern ACT1 in the second direction Y, and the fifth active patterns ACT5 may be spaced in the first direction X and may be symmetrically disposed with the vertical pixel separating pattern DTI_V therebetween.

The fifth active pattern ACT5 disposed in the first sub-pixel group SPX1 and the fifth active pattern ACT5 disposed in the second sub-pixel group SPX2 may be spaced in the second direction Y and may be symmetrically disposed with the horizontal pixel separating pattern DTI_H therebetween.

The fifth active patterns ACT5 respectively disposed in the first to fourth sub-pixel groups SPX1 to SPX4 may include the first to eighth floating diffusion regions FD1 to FD8 of the respective first to fourth sub-pixel groups SPX1 to SPX4.

For example, the respective fifth active patterns ACT5 disposed in the first sub-pixel group SPX1 may include the first floating diffusion region FD1 and the second floating diffusion region FD2, the respective fifth active patterns ACT5 disposed in the second sub-pixel group SPX2 may include the third floating diffusion region FD3 and the fourth floating diffusion region FD4, the respective fifth active patterns ACT5 disposed in the third sub-pixel group SPX3 may include the fifth floating diffusion region FD5 and the sixth floating diffusion region FD6, and the respective fifth active patterns ACT5 disposed in the fourth sub-pixel group SPX4 may include the seventh floating diffusion region FD7 and the eighth floating diffusion region FD8.

The first to eighth transmission gates TG1 to TG8 of the respective first to fourth sub-pixel groups SPX1 to SPX4 may be disposed on the fifth active patterns ACT5 disposed on the respective first to fourth sub-pixel groups SPX1 to SPX4. The first to eighth transmission gates TG1 to TG8 may be disposed in island shapes in a plan view.

The first to eighth transmission gates TG1 to TG8 disposed on the fifth active patterns ACT5 may be spaced from the first to eighth floating diffusion regions FD1 to FD8 included in the fifth active patterns ACT5 in the second direction Y, and may overlap at least some of the first to eighth floating diffusion regions FD1 to FD8 in the third direction Z.

For example, the first transmission gate TG1 and the second transmission gate TG2 may be respectively disposed on the fifth active patterns ACT5 disposed in the first sub-pixel group SPX1, the third transmission gate TG3 and the fourth transmission gate TG4 may be respectively disposed on the fifth active patterns ACT5 disposed in the second sub-pixel group SPX2, the fifth transmission gate TG5 and the sixth transmission gate TG6 may be respectively disposed on the fifth active patterns ACT5 disposed in the third sub-pixel group SPX3, and the seventh transmission gate TG7 and the eighth transmission gate TG8 may be respectively disposed on the fifth active patterns ACT5 disposed in the fourth sub-pixel group SPX4.

Hence, the respective first to eighth transmission gates TG1 to TG8 disposed on the fifth active patterns ACT5 may configure the first to eighth transmission transistors (e.g., first to eighth transmission transistors TT1 to TT8 of FIG. 2) with an extrinsic region doped to the fifth active patterns ACT5.

The transmission gate wires TWR may be respectively disposed on the first to eighth transmission gates TG1 to TG8.

The transmission gate wires TWR may be respectively connected to the first to eighth transmission gates TG1 to TG8 through a transmission gate contact CT_TG.

The floating connection wire FWR may be disposed on the fifth active pattern ACT5 and the pixel separating pattern DTI. The floating connection wire FWR may extend in the first direction X and the second direction Y.

The floating connection wire FWR may connect the first to eighth floating diffusion regions FD1 to FD8. The floating connection wire FWR may be connected to the respective first to eighth floating diffusion regions FD1 to FD8 through a floating diffusion contact CT_FD. That is, the first floating diffusion node (e.g., first floating diffusion node FN1 of FIG. 2) connected to the first to eighth floating diffusion regions FD1 to FD8 may be formed in the pixel group PXG by the floating connection wire FWR.

The floating connection wire FWR may extend along the pixel separating pattern DTI and may be connected to the source follower gate SF and the third active pattern ACT3 disposed on the first active pattern ACT1.

That is, the floating connection wire FWR may be connected to the first source follower gate SF1 and the second source follower gate SF2 through a source follower gate contact CT_SF. The floating connection wire FWR may be connected to a portion of the third active pattern ACT3 disposed on one side of the first conversion gate DCG1 through the fifth contact CT5.

The pixel group PXG may include sixth active patterns ACT6.

The sixth active patterns ACT6 may be disposed in the first to fourth sub-pixel groups SPX1 to SPX4, respectively. The sixth active patterns ACT6 may be disposed in an island shape in the respective first to fourth sub-pixel groups SPX1 to SPX4.

The sixth active patterns ACT6 may be disposed near respective apexes of the first to fourth sub-pixel groups SPX1 to SPX4. That is, the sixth active patterns ACT6 may be spaced from the separating region DCC substantially disposed in the respective centers of the first to fourth sub-pixel groups SPX1 to SPX4 in a diagonal direction of the first direction X and the second direction Y.

At least part of the respective sides of the sixth active patterns ACT6 may be surrounded on the fifth active pattern ACT5 in a plan view. That is, the sixth active patterns ACT6 may be spaced from the first active pattern ACT1 or the third active pattern ACT3 with the fifth active pattern ACT5 therebetween.

The sixth active patterns ACT6 disposed in the same sub-pixel group from among the first to fourth sub-pixel groups SPX1 to SPX4 may be spaced in the first direction X and may be symmetrically disposed with the vertical pixel separating pattern DTI_V therebetween.

The sixth active patterns ACT6 disposed in the different sub-pixel groups from among the first to fourth sub-pixel groups SPX1 to SPX4 may be spaced in the second direction Y and may be symmetrically disposed with the horizontal pixel separating pattern DTI_H therebetween.

Some of the sixth active patterns ACT6 disposed in the same sub-pixel group from among the first to fourth sub-pixel groups SPX1 to SPX4 may be a ground region, and the others may be a dummy region.

For example, two sixth active patterns ACT6 may be disposed in the respective sub-pixel groups SPX1 to SPX4, and one thereof may be one of ground regions (e.g., a first ground region GND1, a second ground region GND2, a third ground region GND3, and a fourth ground region GND4), and the other may be the dummy region DMY_A. However, without being limited thereto, the dummy region DMY_A may be used as a ground region in some embodiments.

The ground wire GWR may extend in the second direction Y on the pixel separating pattern DTI. The ground wire GWR may extend in the first direction X and may be connected to first to fourth ground regions GND1 to GND4. That is, the ground wire GWR may be connected to the first to fourth ground regions GND1 to GND4 through a ground contact CT_GND. A ground voltage or a negative bias voltage may be applied through the ground wire GWR.

A positioning relationship (e.g., location arrangement) and a connection relationship of the first selection gate SEL1, the second selection gate SEL2, and the source follower gate SF disposed on the first active pattern ACT1 and the second active pattern ACT2 are described with reference to FIG. 7A to FIG. 7C.

Figure 7A:
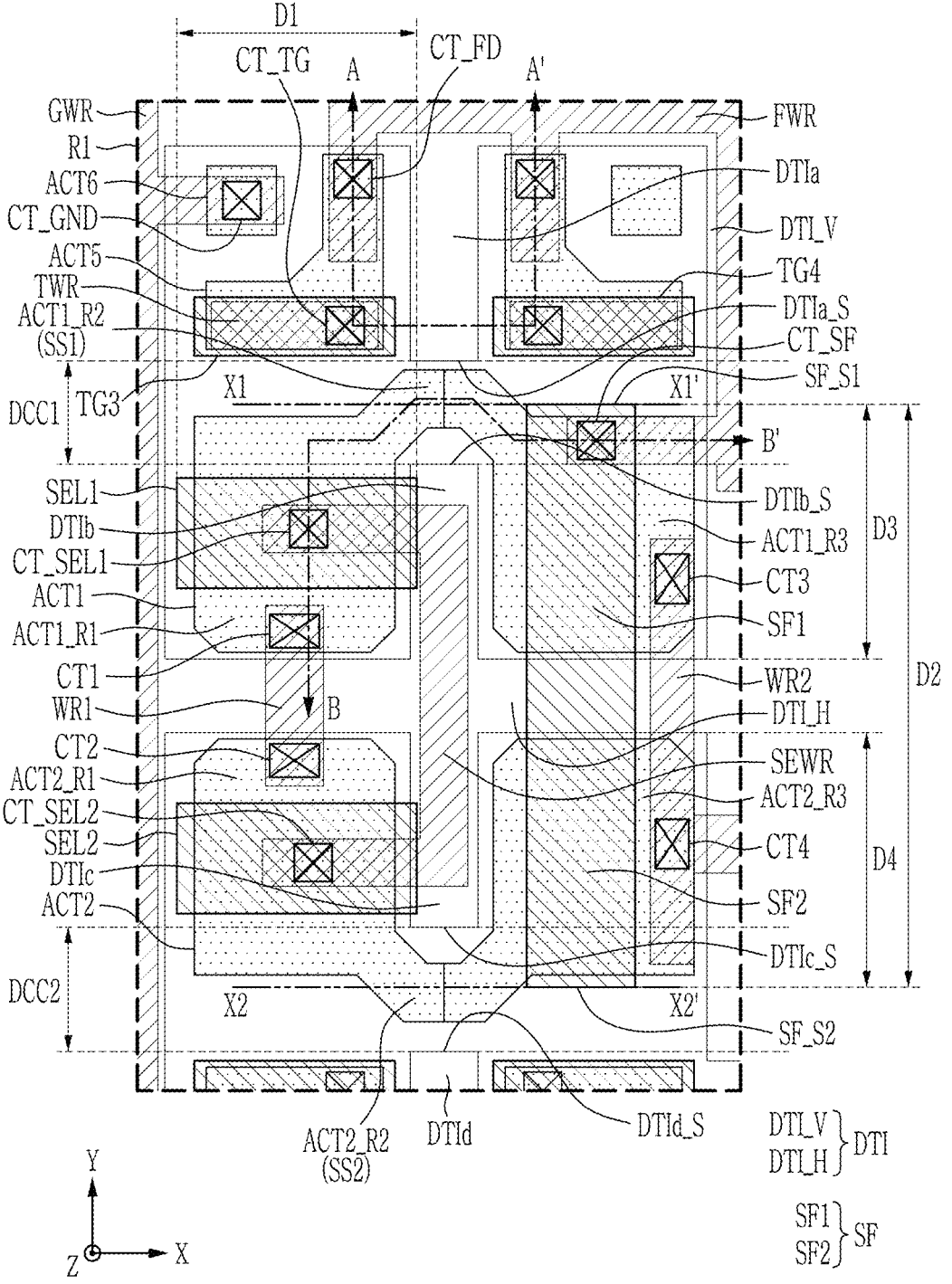
FIG. 7A to FIG. 7C show partially enlarged diagrams of a predetermined region of FIG. 4, according to some embodiments.
Figure 7B:
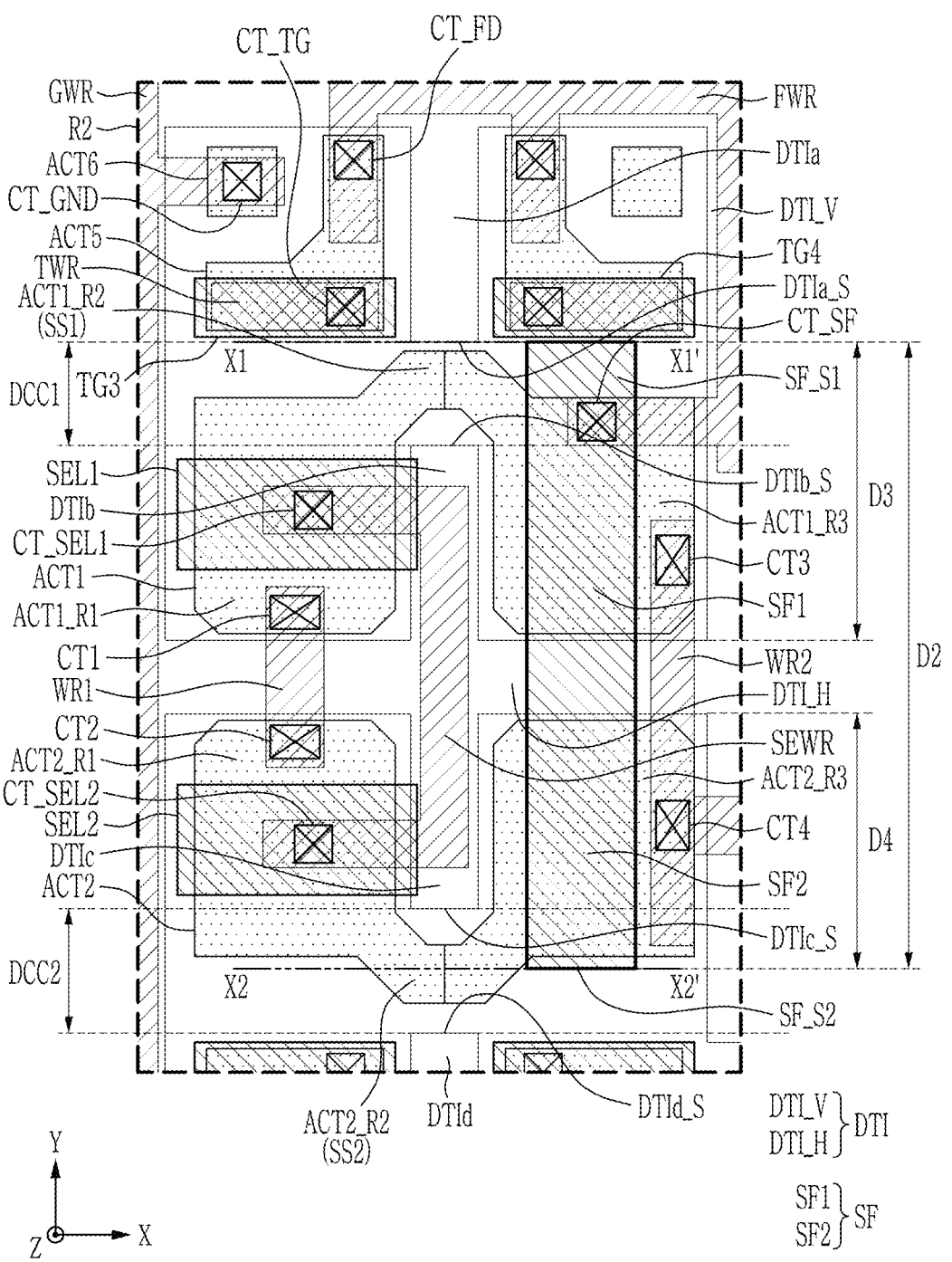
Figure 7C:
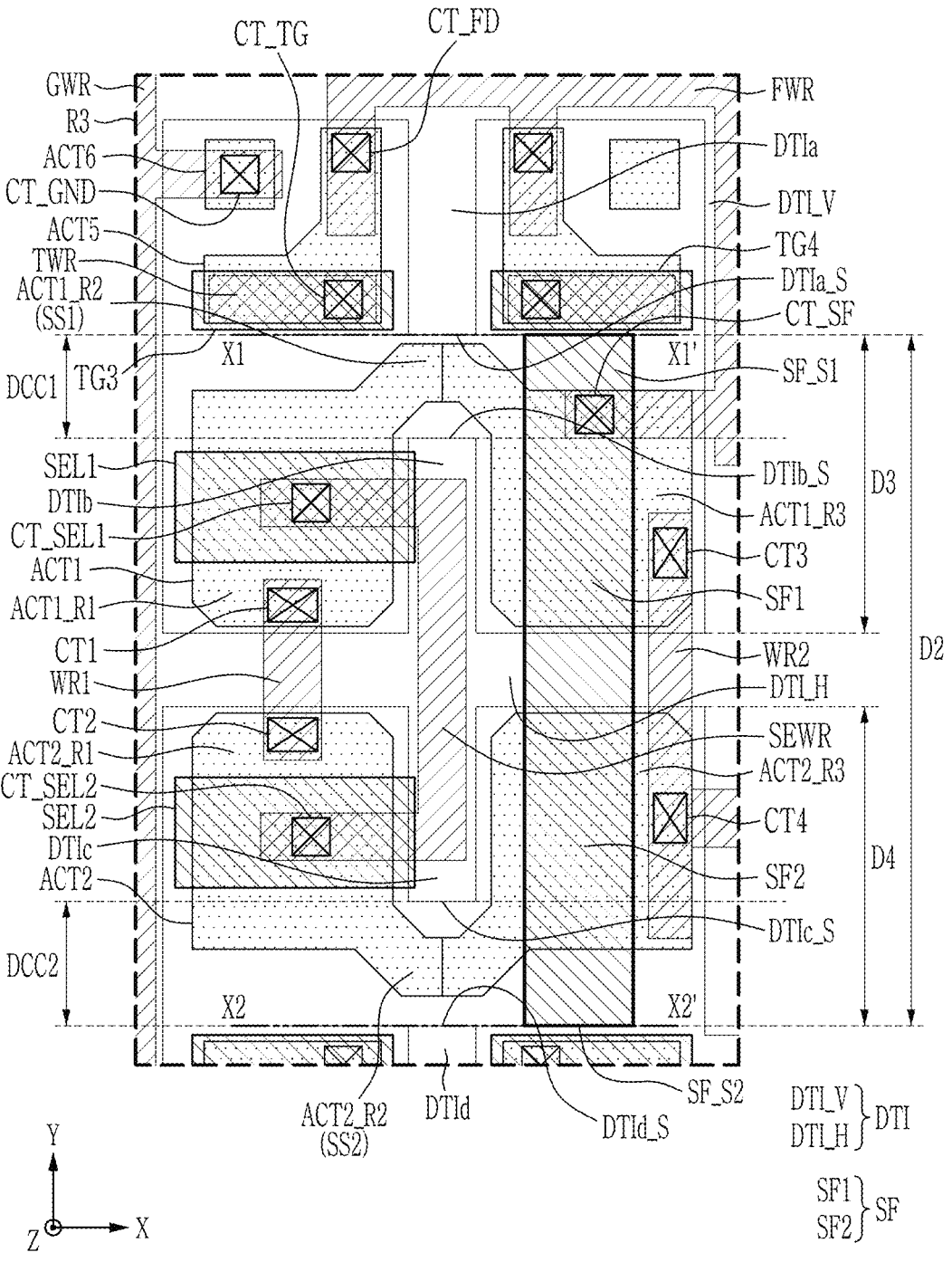

FIG. 7A to FIG. 7C show partially enlarged diagrams of a predetermined region of FIG. 4, according to some embodiments. FIG. 7A shows a partially enlarged view of a region R1 of FIG. 4, according to an embodiment. FIG. 7B and FIG. 7 show partially enlarged diagrams of regions R2 and R3 that correspond to a region R1 of FIG. 4, according to some embodiments.

Referring to FIG. 7A to FIG. 7C, the pixel separating pattern DTI may include a first pixel separating pattern DTIa and a third pixel separating pattern DTIc extending to the one side of the second direction Y from the horizontal pixel separating pattern DTI_H and a second pixel separating pattern DTIb and a fourth pixel separating pattern DTId extending to the other side of the second direction Y from the horizontal pixel separating pattern DTI_H.

In an embodiment, the first pixel separating pattern DTIa may extend to the one side of the second direction Y toward the first active pattern ACT1 between the fifth active pattern ACT5, and the second pixel separating pattern DTIb may extend toward the other side of the second direction Y between the first selection gate SEL1 and the first source follower gate SF1.

The first pixel separating pattern DTIa and the second pixel separating pattern DTIb may be spaced from each other and may face each other in the second direction Y, and since the first pixel separating pattern DTIa is separated from the second pixel separating pattern DTIb, a first separating region DCC1 that may be defined by the first pixel separating pattern DTIa and the second pixel separating pattern DTIb may be disposed between the first pixel separating pattern DTIa and the second pixel separating pattern DTIb.

The third pixel separating pattern DTIc may extend to the one side of the second direction Y toward the second active pattern ACT2 between the second selection gate SEL2 and the second source follower gate SF2, and the fourth pixel separating pattern DTId may extend toward the other side of the second direction Y to face the third pixel separating pattern DTIc in the second direction Y.

Since the third pixel separating pattern DTIc is separated from the fourth pixel separating pattern DTId, a second separating region DCC2 that may be defined by the third pixel separating pattern DTIc and the fourth pixel separating pattern DTId may be disposed between the third pixel separating pattern DTIc and the fourth pixel separating pattern DTId.

The first separating region DCC1 and the second separating region DCC2 may be spaced from each other and may be disposed in the second direction Y with the second pixel separating pattern DTIb and the third pixel separating pattern DTIc therebetween.

As described above, the first selection gate SEL1 may be disposed to overlap the first active pattern ACT1 disposed on the one side of the first direction X in the third direction Z with respect to the second pixel separating pattern DTIb, and the second selection gate SEL2 may be disposed to overlap the second active pattern ACT2 disposed on the one side of the first direction X in the third direction Z with respect to the fourth pixel separating pattern DTId.

The source follower gate SF including the first source follower gate SF1 and the second source follower gate SF2 may extend in the second direction Y to reach the second active pattern ACT2 disposed on the other side of the first direction X with respect to the fourth pixel separating pattern DTId from the first active pattern ACT1 disposed on the other side of the first direction X with respect to the second pixel separating pattern DTIb, and may overlap the first active pattern ACT1 and the second active pattern ACT2 in the third direction Z.

Hence, the first selection gate SEL1 and the first source follower gate SF1 may be disposed on the first active pattern ACT1, and the second selection gate SEL2 and the second source follower gate SF2 may be disposed on the second active pattern ACT2.

That is, part of the source follower gate SF overlapping the first active pattern ACT1 may be the first source follower gate SF1, and part of the source follower gate SF overlapping the second active pattern ACT2 in the third direction Z may be the second source follower gate SF2.

The first active pattern ACT1 may include a first extrinsic region ACT1_R1, a second extrinsic region ACT1_R2, and a third extrinsic region ACT1_R3.

The first extrinsic region ACT1_R1, the second extrinsic region ACT1_R2, and the third extrinsic region ACT1_R3 may respectively be an impurity doped region.

The first extrinsic region ACT1_R1 and the second extrinsic region ACT1_R2 may correspond to a source or a drain of the first selection transistor (e.g., first selection transistor SELT1 of FIG. 2). The second extrinsic region ACT1_R2 and the third extrinsic region ACT1_R3 may correspond to a source or a drain of the first source follower transistor (e.g., first source follower transistor SFT1 of FIG. 2).

The first extrinsic region ACT1_R1 may be disposed on the one side of the first selection gate SEL1 in the second direction Y. That is, the first extrinsic region ACT1_R1 may be disposed between the first selection gate SEL1 and the horizontal pixel separating pattern DTI_H in a plan view.

The second extrinsic region ACT1_R2 may be disposed between the first selection gate SEL1 and the first source follower gate SF1. That is, the second extrinsic region ACT1_R2 may extend to be disposed on one side of the first source follower gate SF1 in the first direction X from the one side of the first selection gate SEL1 in the second direction Y. In other words, the second extrinsic region ACT1_R2 may pass through the first separating region DCC1 from the one side of the second selection gate SEL2, may extend in the first direction X, and may extend in the second direction Y between the second pixel separating pattern DTIb and the one side of the first source follower gate SF1 in the first direction X.

Hence, the second extrinsic region ACT1_R2 may be disposed between the first selection gate SEL1 and the fifth active pattern ACT5, and may be disposed among the first separating region DCC1, the second pixel separating pattern DTIb, and the one side of the first source follower gate SF1.

The third extrinsic region ACT1_R3 may be disposed on the other side of the first source follower gate SF1 in the first direction X. That is, the third extrinsic region ACT1_R3 may be disposed between the first source follower gate SF1 and the vertical pixel separating pattern DTI_V in a plan view.

Hence, the first selection gate SEL1 may configure the first selection transistor (e.g., first selection transistor SELT1 of FIG. 2) with the first extrinsic region ACT_R1 and the second extrinsic region ACT1_R2.

Further, the first source follower gate SF1 may configure the first source follower transistor (e.g., first source follower transistor SFT1 of FIG. 2) with the second extrinsic region ACT1_R2 and the third extrinsic region ACT_R3.

That is, the first selection gate SEL1 and the first source follower gate SF1 may share the second extrinsic region ACT1_R2 of the first active pattern ACT1 and may respectively configure the first source follower transistor SFT1 with the first selection transistor SELT1. In other words, the second extrinsic region ACT1_R2 of the first active pattern ACT1 may correspond to the first sharing source region SS1 of FIG. 2.

Hence, the first end of the first selection transistor SELT1 may be connected to the first end of the first source follower transistor SFT1 through the second extrinsic region ACT1_R2 of the first active pattern ACT1.

The second active pattern ACT2 may include a fourth extrinsic region ACT2_R1, a fifth extrinsic region ACT2_R2, and a sixth extrinsic region ACT2_R3.

As described above, the second active pattern ACT2 may be symmetrically disposed with the first active pattern ACT1 second direction Y with the horizontal pixel separating pattern DTI_H therebetween.

Accordingly, the descriptions on the first extrinsic region ACT1_R1, the second extrinsic region ACT1_R2, and the third extrinsic region ACT1_R3 of the first active pattern ACT1 may be substantially similarly applied to the fourth extrinsic region ACT2_R1, the fifth extrinsic region ACT2_R2, and the sixth extrinsic region ACT2_R3 of the second active pattern ACT2.

The fourth extrinsic region ACT2_R1, the fifth extrinsic region ACT2_R2, and the sixth extrinsic region ACT2_R3 may be regions doped with impurities.

The fourth extrinsic region ACT2_R1 and the fifth extrinsic region ACT2_R2 may correspond to a source or a drain of the second selection transistor (e.g., second selection transistor SELT2 of FIG. 2). The fifth extrinsic region ACT2_R2 and the sixth extrinsic region ACT2_R3 may correspond to a source or a drain of the second source follower transistor (e.g., second source follower transistor SFT2 of FIG. 2).

The fourth extrinsic region ACT2_R1 may be disposed on the other side of the second selection gate SEL2 in the second direction Y. That is, the fourth extrinsic region ACT2_R1 may be disposed between the second selection gate SEL2 and the horizontal pixel separating pattern DTI_H.

The fifth extrinsic region ACT2_R2 may be disposed between the second selection gate SEL2 and the second source follower gate SF2. That is, the fifth extrinsic region ACT2_R2 may pass through the second separating region DCC2 from the one side of the second selection gate SEL2, may extend in the first direction X, and may extend in the second direction Y between the third pixel separating pattern DTIc and the one side of the second source follower gate SF2 in the first direction X.

Hence, the fifth extrinsic region ACT2_R2 may be disposed in the second separating region DCC2.

The sixth extrinsic region ACT2_R3 may be disposed on the other side of the second source follower gate SF2 in the first direction X. That is, the sixth extrinsic region ACT2_R3 may be disposed between the second source follower gate SF2 and the vertical pixel separating pattern DTI_V in a plan view.

Accordingly, the second selection gate SEL2 may configure the second selection transistor (e.g., second selection transistor SELT2 of FIG. 2) with the fourth extrinsic region ACT2_R1 and the fifth extrinsic region ACT2_R2.

Further, the second source follower gate SF2 may configure the second source follower transistor (e.g., second source follower transistor SFT2 of FIG. 2) with the fifth extrinsic region ACT2_R2 and the sixth extrinsic region ACT2_R3.

That is, the second selection gate SEL2 and the second source follower gate SF2 may share the fifth extrinsic region ACT2_R2 of the second active pattern ACT2 and may respectively configure the second source follower transistor SFT2 with the second selection transistor SELT2. In other words, the fifth extrinsic region ACT2_R2 of the second active pattern ACT2 may correspond to the second sharing source region SS2 of FIG. 2.

Hence, the first end of the second selection transistor SELT2 may be connected to the first end of the second source follower transistor SFT2 through the fifth extrinsic region ACT2_R2 of the second active pattern ACT2.

Although FIG. 7A shows that the first selection gate SEL1 and the second selection gate SEL2 extend in the first direction X crossing the elongation direction of the source follower gate SF, the present disclosure is not limited thereto. For example, the first selection gate SEL1 and the second selection gate SEL2 may extend in the second direction Y that is the elongation direction of the source follower gate SF.

As another example, the first selection gate SEL1 may extend in the first direction X crossing the elongation direction of the source follower gate SF, and the second selection gate SEL2 may extend in the second direction Y that is the elongation direction of the source follower gate SF.

In such an example, the first selection gate SEL1 may extend in the second direction Y that is the elongation direction of the source follower gate SF, and the second selection gate SEL2 may extend in the first direction X that is the elongation direction of the source follower gate SF.

The first end of the first selection transistor (e.g., first selection transistor SELT1 of FIG. 2) may be connected to the first end of the second selection transistor (e.g., second selection transistor SELT2 of FIG. 2) by the first connection wire WR1. That is, the first extrinsic region ACT1_R1 of the first active pattern ACT1 may be connected to the fourth extrinsic region ACT2_R1 of the second active pattern ACT2 by the first connection wire WR1.

The first selection gate SEL1 may be connected to the second selection gate SEL2 by the selection gate connection wire SEWR. That is, a same signal may be applied to the first selection gate SEL1 and the second selection gate SEL2 by the selection gate connection wire SEWR.

The first end of the first source follower transistor (e.g., first source follower transistor SFT1 of FIG. 2) may be connected to the first end of the second source follower transistor (e.g., second source follower transistor SFT2 of FIG. 2) by the second connection wire WR2. The second connection wire WR2 may be connected to the pixel power source voltage wire (e.g., pixel power source voltage $V_{Pix}$ of FIG. 2), and a same pixel power source voltage may be applied to the first source follower transistor SFT1 and the first source follower transistor SFT2.

The first connection wire WR1 may be connected to the output voltage wire (e.g., output voltage Vout of FIG. 2), and a same output voltage may be applied to the first selection transistor SELT1 and the second selection transistor SELT2.

In an embodiment, the first selection gate SEL1 and the second selection gate SEL2 may extend in the first direction X, and the source follower gate SF may extend in the second direction Y. That is, the first source follower gate SF1 and the second source follower gate SF2 may extend in the second direction Y.

The first selection gate SEL1 and the second selection gate SEL2 may respectively have a first length D1 in the first direction X. The source follower gate SF may have a second length D2 in the second direction Y, the first source follower gate SF1 may have a third length D3 in the second direction Y, and the second source follower gate SF2 may have a fourth length D4 in the second direction Y.

In an embodiment, the first length D1 may be less (e.g., shorter) than the second length D2, the third length D3, and the fourth length D4. The second length D2 may be greater (e.g., longer) than the third length D3 and the fourth length D4, and the third length D3 may be the same as or substantially similar to the fourth length D4. However, the first length D1, the second length D2, the third length D3, and the fourth length D4 are not limited thereto and may be changed in many ways without departing from the scope of the present disclosure. For example, the third length D3 may be different from the fourth length D4.

To compare with the image sensor according to an embodiment, an image sensor according to a reference example may be considered. Regarding the image sensor according to a reference example, a semiconductor layer included in the first selection transistor and a semiconductor layer included in the first source follower transistor may not be integrally formed but may be separated from each other.

Hence, the first selection transistor may be connected to the first source follower transistor through another layer (e.g., an additional connecting member disposed on the first metal layer). Therefore, a contact portion for connecting the semiconductor layer of the first selection transistor and the connecting member may be needed, and a contact portion for connecting the semiconductor layer of the second selection transistor and the connecting member may be needed.

Similarly, a semiconductor layer included in the second selection transistor and a semiconductor layer included in the second source follower transistor may not be integrally formed but may be separated from each other.

Hence, the second selection transistor may be connected to the second source follower transistor through an additional connecting member, and a contact portion for the connection is needed.

When gates of the first source follower transistor and the second source follower transistor are formed in parallel to the second direction Y, it may be difficult to obtain a space for forming the contact portion.

Therefore, the gates of the first source follower transistor and the second source follower transistor may be formed in parallel to the first direction X, and channel widths of the first source follower transistor and the second source follower transistor may be relatively reduced.

Regarding the image sensor 100, according to an embodiment, the first selection transistor SELT1 and the first source follower transistor SFT1 may share the second extrinsic region ACT1_R2 of the first active pattern ACT1, and as a result, the first selection transistor SELT1 may be connected to the first source follower transistor SFT1 without an additional connecting member.

Similarly, when the second selection transistor SELT2 and the second source follower transistor SFT2 share the fifth extrinsic region ACT2_R2 of the second active pattern ACT2, the second selection transistor SELT2 may be connected to the second source follower transistor SFT2 without an additional connecting member.

Therefore, there may not be need to acquire a space for forming the contact portion, and a sufficient channel width may be obtained by forming the first source follower gate SF1 and the second source follower gate SF2 to extend in the second direction Y.

Regarding the image sensor 100, according to an embodiment, when the first source follower gate SF1 and the second source follower gate SF2 extend in the second direction Y and respectively overlap the first active pattern ACT1 and the second active pattern ACT2 in the third direction Z, the respective channel widths of the first source follower transistor (e.g., first source follower transistor SFT1 of FIG. 2) and the second source follower transistor (e.g., second source follower transistor SFT2 of FIG. 2) may be increased in comparison to the case when the first source follower gate SF1 and the second source follower gate SF2 extend in the first direction X and overlap the respective first active pattern ACT1 and the second active pattern ACT2 in the third direction Z.

That is, the widths of a portion of the first active pattern ACT1 and a portion of the second active pattern ACT2 overlapping the first source follower gate SF1 and the second source follower gate SF2 respectively in the third direction Z and respectively functioning as the channels of the first source follower transistor SFT1 and the second source follower transistor SFT2 may be increased.

In an embodiment, when the first source follower gate SF1 and the second source follower gate SF2 extend in the first direction X, the widths of the channels of the first source follower transistor SFT1 and the second source follower transistor SFT2 may be parallel to the first direction X. Alternatively or additionally, when the first source follower gate SF1 and the second source follower gate SF2 extend in the second direction Y, the widths of the channels of the first source follower transistor SFT1 and the second source follower transistor SFT2 may be parallel to the first direction X.

Further, when the source follower gate SF extends in the second direction Y, positioning and connection relationships with other elements included in the pixel group PXG may be diversified.

The source follower gate SF may include a first end SF_S1 disposed on the one side of the second direction Y and a second end SF_S2 disposed on the other side of the second direction Y. The first end SF_S1 may correspond to an end of the first source follower gate SF1, and the second end SF_S2 may correspond to an end of the second source follower gate SF2.

In an embodiment, the first end SF_S1 of the source follower gate SF may overlap the first separating region DCC in the first direction X. That is, the first end SF_S1 of the source follower gate SF may be disposed in a line X1-X1' that is a virtual extension line in the first direction X disposed in the first separating region DCC1. In other words, the first end SF_S1 of the source follower gate SF may be arranged on a border that is different from a border of the end DTIa_S of the first pixel separating pattern DTIa and the end DTIb_S of the second pixel separating pattern DTIb.

In an embodiment, the line X1-X1' may be disposed between the first pixel separating pattern DTIa and the second pixel separating pattern DTIb, and may represent a virtual extension line extending in the first direction X.

The second end SF_S2 of the source follower gate SF may be disposed in the line X2-X2' that is a virtual extension line disposed in the second separating region DCC2 in the first direction X. That is, the second end SF_S2 of the source follower gate SF may be arranged on the different border from the end DTIc_S of the third pixel separating pattern DTIc and the end DTId_S of the fourth pixel separating pattern DTId. The line X2-X2' may be disposed between the third pixel separating pattern DTIc and the fourth pixel separating pattern DTId, and may represent a virtual extension line extending in the first direction X. However, without being limited thereto, the relationship among the ends SF_S1 and SF_S2 of the source follower gate SF, the first separating region DCC1, and the second separating region DCC2 may be modifiable in many ways without departing from the scope of the present disclosure.

For example, as shown in FIG. 7B, the first end SF_S1 of the source follower gate SF may extend in the second direction Y. That is, the first end SF_S1 of the source follower gate SF may be arranged on the same and/or substantially similar border as the end DTIa_S of the first pixel separating pattern DTIa. In other words, the first end SF_S1 of the source follower gate SF may be disposed in the line X1-X1' that is a virtual extension line disposed on the end DTIa_S of the first pixel separating pattern DTIa in the first direction X.

As another example, as shown in FIG. 7C, the first end SF_S1 and second end SF_S2 of the source follower gate SF may further extend on the one side and the other side of the second direction Y.

That is, the first end SF_S1 of the source follower gate SF may be arranged on the same and/or substantially similar border as the end DTIa_S of the first pixel separating pattern DTIa, and the second end SF_S2 may be arranged on the same and/or substantially similar border as the end DTId_S of the fourth pixel separating pattern DTId. In other words, the first end SF_S1 of the source follower gate SF may be disposed in the line X1-X1' that is a virtual extension line disposed on the end DTIa_S of the first pixel separating pattern DTIa in the first direction X, and the second end SF_S2 of the source follower gate SF may be disposed in the line X2-X2' that is a virtual extension line disposed on the end DTId_S of the fourth pixel separating pattern DTId in the first direction X.

A cross-sectional structure of an image sensor, according to an embodiment, is described with reference to FIG. 8 and FIG. 9.

Figure 8:
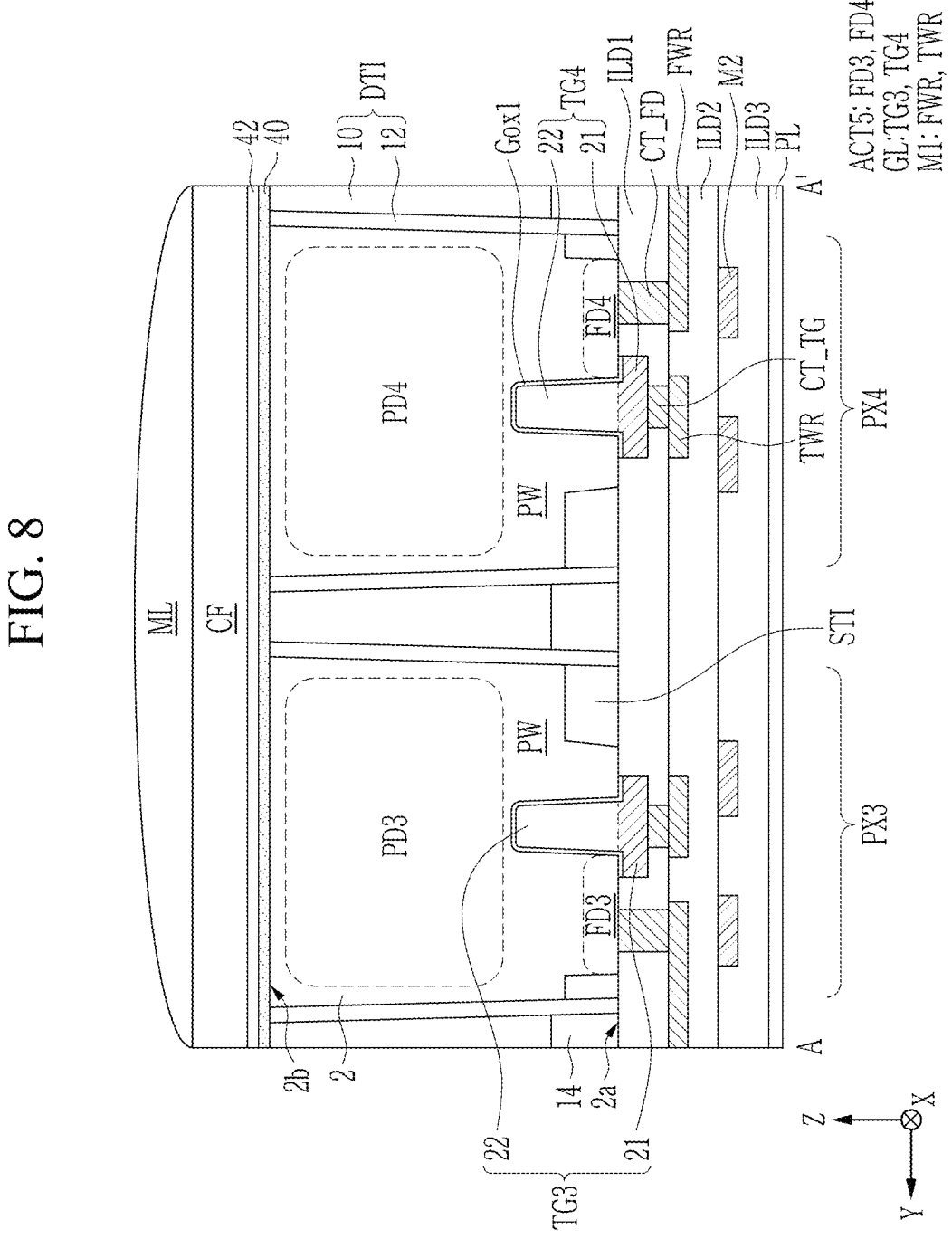
FIG. 8 shows a cross-sectional view with respect to a line A-A' of FIG. 7A, according to an embodiment.

FIG. 8 shows a cross-sectional view with respect to a line A-A' of FIG. 7A, according to an embodiment. FIG. 9 shows a cross-sectional view with respect to a line B-B' of FIG. 7A, according to an embodiment.

Figure 9:
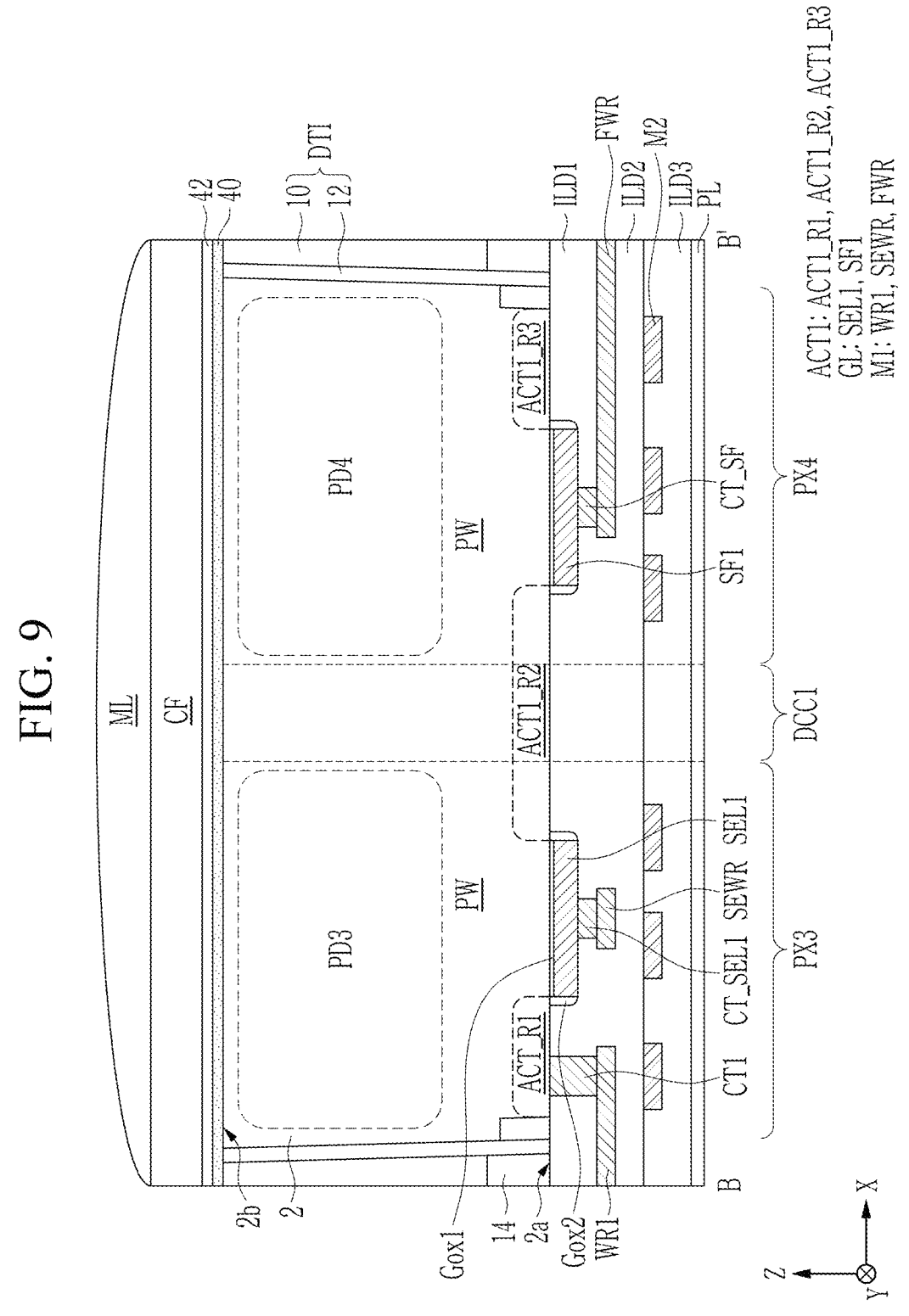
FIG. 9 shows a cross-sectional view with respect to a line B-B' of FIG. 7A, according to an embodiment.

FIG. 8 and FIG. 9 show a cross-sectional structure of the third sub-pixel group SPX3 of the first to fourth sub-pixel groups SPX1 to SPX4, and the cross-sectional structure of the third sub-pixel group SPX3 may be the same as and/or substantially equivalent to the cross-sectional structures of the first sub-pixel group SPX1, the second sub-pixel group SPX2, and the fourth sub-pixel group SPX4.

Hereinafter, the cross-sectional structure of the third sub-pixel group SPX3 may be mainly described, and repeated descriptions of the cross-sectional structures of the first sub-pixel group SPX1, the second sub-pixel group SPX2, and the fourth sub-pixel group SPX4 may be omitted for the sake of brevity.

Referring to FIG. 8 and FIG. 9, the image sensor 100 may include a substrate 2, a pixel separating pattern DTI, third and fourth photodiodes PD3 and PD4, third and fourth floating diffusion regions FD3 and FD4, and first and fifth active patterns ACT1 and ACT5 disposed in the substrate 2, and a gate layer GL, a first metal layer M1, a second metal layer M2, a color filters CF, and micro lenses ML disposed on the substrate 2.

The substrate 2 may be and/or may include, for example, a bulk silicon and/or a silicon-on-insulator (SOI). The substrate 2 may be and/or may include a silicon substrate, and/or may include other materials, such as, but not limited to, silicon germanium (SiGe), indium antimonide (InSb), lead telluride (PbTe), indium arsenic (InAs), indium phosphide (InP), gallium arsenic (GaAs), and/or gallium antimonide (GaSb). In an embodiment, the substrate 2 may be a formation of an epitaxial layer on a base substrate. The substrate 2 may be doped with a first impurity. For example, the first impurity may be a p-type impurity.

The substrate 2 may include a first side 2a and a second side 2b facing each other. The second side 2b of the substrate 2 may be a light receiving side to which light is input. The first side 2a may be a front side of the substrate 2, and the second side 2b may be a rear side of the substrate 2. However, the present disclosure is not limited in this regard.

The pixel separating pattern DTI may at least partially penetrate the substrate 2. For example, the pixel separating pattern DTI may extend in the third direction Z and may connect the first side 2a and the second side 2b of the substrate 2 in a cross-sectional view. However, without being limited thereto, in some embodiments, the pixel separating pattern DTI may not penetrate the substrate 2 and may be spaced from the first side 2a of the substrate 2.

The pixel separating pattern DTI may be disposed among the adjacent sub-pixel groups SPX1 to SPX4 of FIG. 3. For example, the pixel separating pattern DTI may separate the first sub-pixel group SPX1 and the third sub-pixel group SPX3 and may separate the second sub-pixel group SPX2 and the fourth sub-pixel group SPX4.

The pixel separating pattern DTI may be disposed between the third and fourth pixels PX3 and PX4, and may separate the third and fourth pixels PX3 and PX4.

The pixel separating pattern DTI may be disposed between the adjacent third and fourth photodiodes PD3 and PD4. The pixel separating pattern DTI may separate the adjacent photodiodes electrically and/or optically.

The pixel separating pattern DTI may include a separated conductive pattern 10. The separated conductive pattern 10 may include a conducting material having a different refractive index from the substrate 2. The separated conductive pattern 10 may, for example, include impurity doped poly-silicon and/or a metal.

The pixel separating pattern DTI may further include a separated insulation pattern 12 provided between the separated conductive pattern 10 and the substrate 2. The separated insulation pattern 12 may include an insulating material having a different refractive index from the substrate 2. For example, the separated insulation pattern 12 may include silicon oxide (SiO).

The image sensor 100 may further include a capping insulation pattern 14 and an isolation layer STI.

The capping insulation pattern 14 may be disposed below the separated conductive pattern 10. The capping insulation pattern 14 may include, for example, at least one of silicon oxide (SiO), silicon oxynitride (SiON), and silicon nitride (SiN).

The isolation layer STI may be disposed on a side of the capping insulation pattern 14. The separated insulation pattern 12 may be disposed between the isolation layer STI and the capping insulation pattern 14.

The isolation layer STI may be formed by a shallow trench isolation (STI) method. The isolation layer STI may be a single layer or a multilayer of at least one of a silicon oxide layer (SiO), a silicon nitride (SiN), and a silicon oxynitride (SiON) layer.

The first and fifth active patterns ACT1 and ACT5 may be disposed in the substrate 2. The first and fifth active patterns ACT1 and ACT5 may be formed in the substrate 2 so that the first and fifth active patterns ACT1 and ACT5 may have a predetermined depth from the first side 2a of the substrate 2. The first and fifth active patterns ACT1 and ACT5 may be doped into the substrate 2 as a second impurity. For example, the second impurity may be an n-type impurity (e.g., phosphorus (P) or arsenic (As)).

The first extrinsic region ACT1_R1 and the third extrinsic region ACT1_R3 of the first active pattern ACT1 may overlap the third photodiode PD3 and fourth photodiode PD4 in the third direction Z, respectively. The second extrinsic region ACT1_R2 of the first active pattern ACT1 may overlap the third and fourth photodiodes PD3 and PD4 and the first separating region DCC1 in the third direction Z.

The fifth active pattern ACT5 may include third and fourth floating diffusion regions FD3 and FD4. The third and fourth floating diffusion regions FD3 and FD4 may overlap the third photodiode PD3 and the fourth photodiode PD4 in the third direction Z, respectively.

The third and fourth photodiodes PD3 and PD4 for receiving light may be disposed in the substrate 2. The light input from the outside may be converted into electrical signals by the third and fourth photodiodes PD3 and PD4.

The third and fourth photodiodes PD3 and PD4 may be disposed to correspond to the third and fourth pixels PX3 and PX4, respectively. For example, the third photodiode PD3 may be disposed to correspond to the third pixel PX3, and the fourth photodiode PD32 may be disposed to correspond to the fourth pixel PX4.

The photodiodes PD may be doped with the second impurity that may be different from the first impurity doped into the substrate 2. For example, the second impurity may be the n-type impurity.

In some embodiments, the third and fourth photodiodes PD3 and PD4 may be disposed nearer the second side 2b of the substrate 2 than the first side 2a of the substrate 2. In some embodiments, the third and fourth photodiodes PD3 and PD4 may have a potential slope in the third direction Z. For example, a concentration of the impurity doped to the third and fourth photodiodes PD3 and PD4 may be reduced when approaching the first side 2a from the second side 2b.

The image sensor 100 may further include a well region PW disposed between the third and fourth photodiodes PD3 and PD4 and the second side 2b of the substrate 2.

The first impurity doped to the substrate 2 may be doped to the well region PW. For example, the first impurity may be the p-type impurity.

The concentration of the impurity doped to the well region PW may be greater than or equal to the concentration of the impurity doped to the substrate 2. For example, when the third and fourth photodiodes PD3 and PD4 are doped with the n-type impurities (e.g., phosphorus (P) or arsenic (As)), the region to which the n-type impurities of the third and fourth photodiodes PD3 and PD4 are doped may form a PN junction with the p-type impurity region of the adjacent substrate 2 and/or the well region PW and may configure the third and fourth photodiodes PD3 and PD4, and when light is input, pairs of electrons and holes may be generated by the PN junction.

The gate layer GL may be disposed on the second side 2b of the substrate 2.

The third and fourth transmission gates TG3 and TG4 may be disposed in the substrate 2 and on the first side 2a of the substrate 2. The third and fourth transmission gates TG3 and TG4 may be a vertical type. For example, the third and fourth transmission gates TG3 and TG4 may include a first transmission gate portion 21 disposed on the first side 2a of the substrate 2 and a second transmission gate portion 22 protruding into the substrate 2.

In some embodiments, the third and fourth transmission gates TG3 and TG4 may be a planar type including no second transmission gate portion 22 but the first transmission gate portion 21.

The first selection gate SEL1 and the first source follower gate SF1 may be disposed on the first side 2a of the substrate 2.

A first gate insulating layer Gox1 may be disposed between the third and fourth transmission gates TG3 and TG4 and the substrate 2. The first gate insulating layer Gox1 may be disposed between the first selection gate SEL1 and the substrate 2 and between the first source follower gate SF1 and the substrate 2

A second gate insulating layer Gox2 may be disposed on respective sides of the first selection gate SEL1 and the first source follower gate SF1.

The first gate insulating layer Gox1 and the second gate insulating layer Gox2 may be a single layer or a multilayer of at least one of the silicon oxide (SiO) layer, the metal oxide silicon nitride (SiN) layer, and the silicon oxynitride (SiON) layer.

The image sensor 100 may further include interlayer insulating layers (e.g., a first interlayer insulating layer ILD1, a second interlayer insulating layer ILD2, and a third interlayer insulating layer ILD3), a passivation layer PL, a fixed charge layer 40, and an antireflection layer 42.

The first to third interlayer insulating layers ILD1 to ILD3 and the passivation layer PL may be sequentially stacked on the first side 2a of the substrate 2. The first to third interlayer insulating layers ILD1 to ILD3 may be a single layer or a multilayer of at least one of, for example, the silicon oxide (SiO), the silicon nitride (SiN), the silicon oxynitride (SiON), and porous insulators. The passivation layer PL may include, for example, the silicon nitride (SiN).

The first interlayer insulating layer ILD1 may cover the gate layer GL.

The first metal layer M1 may be disposed between the first interlayer insulating layer ILD1 and the second interlayer insulating layer ILD2. That is, the floating connection wire FWR, the transmission gate wire TWR, the first connection wire WR1, and the selection gate connection wire SEWR may be disposed between the first interlayer insulating layer ILD1 and the second interlayer insulating layer ILD2. The second interlayer insulating layer ILD2 may cover the first metal layer M1.

In some embodiments, other wires included in the first metal layer M1 may be further disposed between the first interlayer insulating layer ILD1 and the second interlayer insulating layer ILD2. For example, the ground wire GWR, the first expanding metal pattern EP1, the second expanding metal pattern EP2, the first conversion gate wire DWR1, the second conversion gate wire DWR2, the reset gate wire RWR, the second connection wire WR2, and the third connection wire WR3 may be further disposed between the first interlayer insulating layer ILD1 and the second interlayer insulating layer ILD2.

The floating connection wire FWR may be connected to the floating diffusion regions FD3 and FD4 by the floating diffusion contact CT_FD passing through the first interlayer insulating layer ILD1, and the floating connection wire FWR may be connected to the first source follower gate SF1 by the first source follower gate contact CT_SF passing through the first interlayer insulating layer ILD1.

The transmission gate wire TWR may be connected to the transmission gates TG3 and TG4 by the transmission gate contact CT_TG passing through the first interlayer insulating layer ILD1.

The first connection wire WR1 may be connected to the first extrinsic region ACT1_R1 by a first contact CT passing through the first interlayer insulating layer ILD1.

The selection gate connection wire SEWR may be connected to the first selection gate SEL1 by the first selection gate contact CT_SEL1 passing through the first interlayer insulating layer ILD1.

The second metal layer M2 may be disposed between the second interlayer insulating layer ILD2 and the third interlayer insulating layer ILD3. The third interlayer insulating layer ILD3 may cover the second metal layer M2.

In some embodiments, the wires included in the gate layer GL disposed on the second side 2b of the substrate 2 may be connected through the second metal layer M2. In some embodiments, the first metal layer M1 disposed between the first interlayer insulating layer ILD1 and the second interlayer insulating layer ILD2 may be connected to part of the second metal layer M2 through a via passing through the second interlayer insulating layer ILD2.

The fixed charge layer 40 may be disposed on the second side 2b of the substrate 2. The fixed charge layer 40 may contact the second side 2b.

The fixed charge layer 40 may be made of a metal oxide or a metal fluoride including at least one metal of hafnium (Hf), zirconium (Zr), aluminum (AI), tantalum (Ta), titanium (Ti), yttrium (Y), and lanthanide (Ln).

Holes may be accumulated around the fixed charge layer 40. As a result, generation of dark currents and white spots may be efficiently reduced. The fixed charge layer 40 may be at least one of an aluminum oxide (AIO) layer and a hafnium oxide (HfO) layer.

The antireflection layer 42 may be disposed on the fixed charge layer 40. The antireflection layer 42 may, for example, include the silicon nitride (SiN).

The color filters CF may be disposed on the antireflection layer 42. The color filters CF may be disposed corresponding to the third and fourth photodiodes PD3 and PD4.

The micro lenses ML for collecting light input from the outside may be disposed on the color filters CF. The color filters CF and the micro lenses ML are described with reference to FIG. 12 to FIG. 15.

Image sensors, according to another embodiment, may be described with reference to FIG. 10 and FIG. 11.

Figure 10:
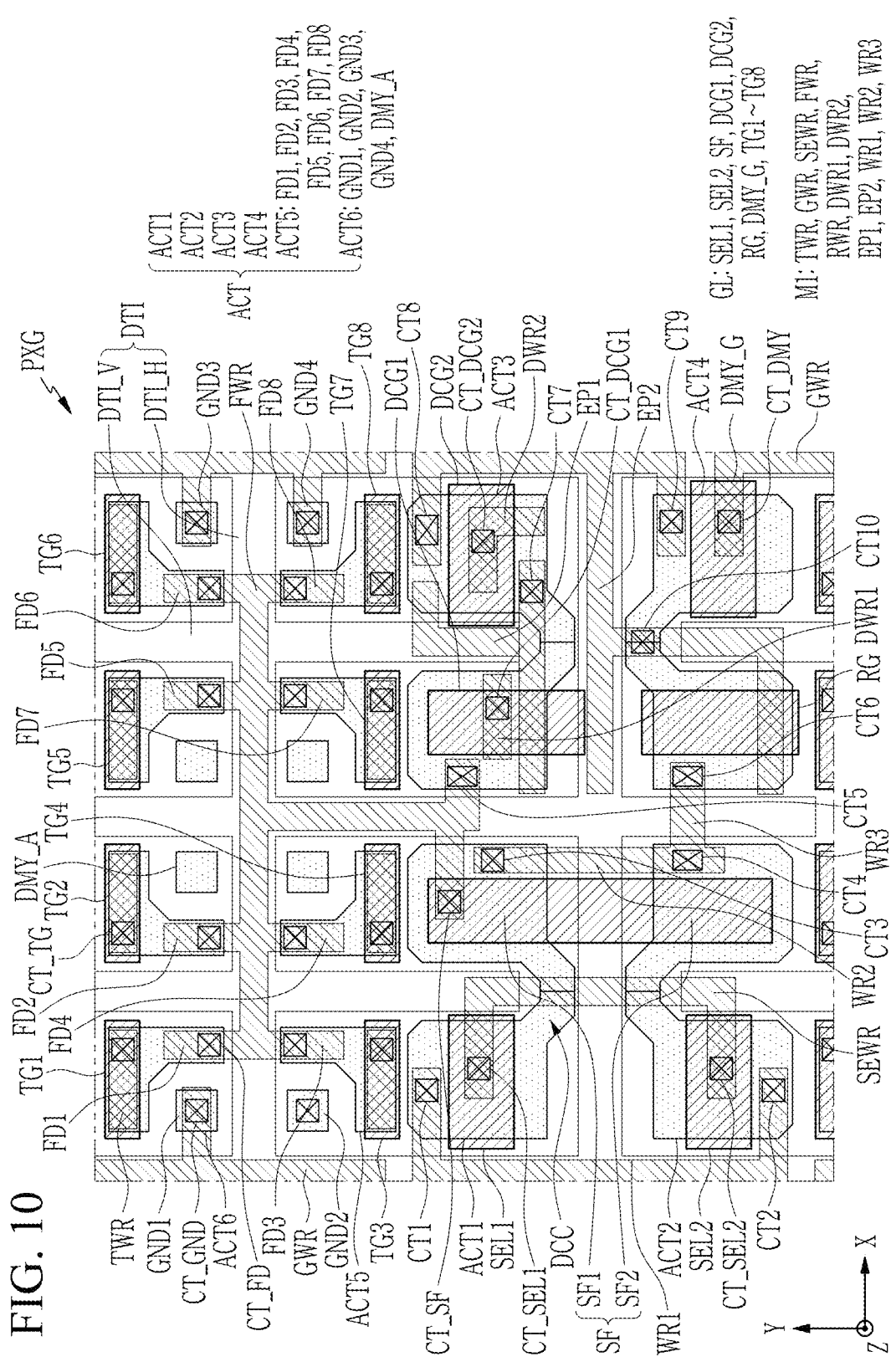
FIG. 10 and FIG. 11 show layouts of a pixel group of an image sensor, according to some embodiments.
Figure 11:
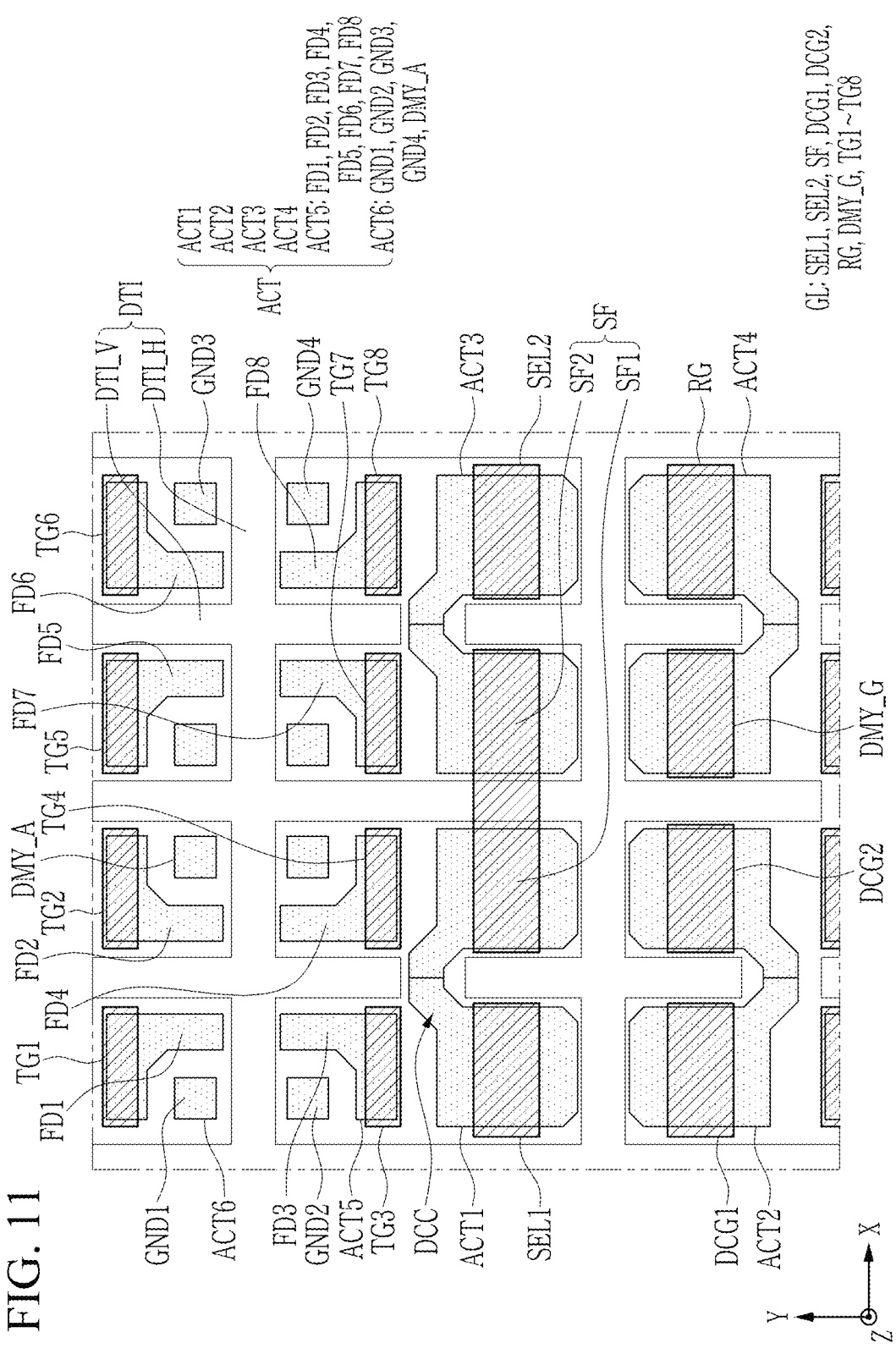

FIG. 10 and FIG. 11 show layouts of a pixel group of an image sensor, according to some embodiments.

FIG. 11 may not show the first metal layer M1 and contacts so as to describe a relationship between the gate layer GL and the active pattern ACT.

The image sensor 100, according to an embodiment, described with reference to FIG. 10 and FIG. 11 may include and/or may be similar in many respects to the image sensor described with reference to FIG. 4 to FIG. 6, and may include additional features not mentioned above. Consequently, repeated descriptions thereof may be omitted for the sake of brevity and differences may be mainly described. Further, substantially similar constituent elements of the previous description may use same reference numerals.

Referring to FIG. 10, differing from the pixel group PXG of the image sensor according to an embodiment shown in FIG. 4, the shapes of the first active pattern ACT1, the second active pattern ACT2, the third active pattern ACT3, and the fourth active pattern ACT4 in a plan view may be different.

Accordingly, as the pixel separating pattern DTI is spaced and separated in the second direction Y, the defined position of the separating region DCC, the position of the first metal layer M1, and the position of the contacts for connecting the first metal layer M1 and the gate layer GL may be different.

According to an embodiment shown in FIG. 10, differing from an embodiment shown in FIG. 4, the separating region DCC may be defined by the pixel separating pattern DTI extending in the first direction X and the pixel separating pattern DTI extending in the second direction Y. That is, the pixel separating pattern DTI extending in the first direction X and the pixel separating pattern DTI extending in the second direction Y may be disposed in the second direction Y.

Further, according to an embodiment shown in FIG. 10, differing from that the separating region DCC is disposed in the centers of the first to fourth sub-pixel groups SPX1 to SPX4, the separating region DCC may be disposed on the one side of the second direction Y or the other side of the second direction Y in the respective first to fourth sub-pixel groups SPX1 to SPX4, and may be disposed near the sides of the first to fourth sub-pixel groups SPX1 to SPX4 defined by the pixel separating pattern DTI.

That is, the separating regions DCC disposed in the respective first to fourth sub-pixel groups SPX1 to SPX4 may be spaced from each other in the second direction Y with the pixel separating pattern DTI extending in the first direction X.

As the position of the separating region DCC becomes different, the shapes of the first active pattern ACT1, the second active pattern ACT2, the third active pattern ACT3, and the fourth active pattern ACT4 in a plan view may become different.

That is, the planar shapes of the first metal layer M1 for connecting the first active pattern ACT1, the second active pattern ACT2, the third active pattern ACT3, and the fourth active pattern ACT4 to each other or connecting the gate layer GL to each other, and the positions of the contacts may become different.

For example, the shapes of the first connection wire WR1, the second conversion gate wire DWR2, the second expanding metal pattern EP2, and the ground wire GWR in a plan view may become different. That is, the extending shapes of the wires included in the first metal layers M1 in a plan view may become different.

Further, as the shapes of the first metal layers M1 in a plan view become different, the positions of the contacts may become different.

For example, the positions of the first contact CT1, the second contact CT2, the seventh contact CT7, the eighth contact CT8, the ninth contact CT9, and the tenth contact CT10 in a plan view may become different.

Referring to FIG. 11, differing from the pixel group PXG of the image sensor according to an embodiment shown in FIG. 4, the positioning of the gate layer GL disposed on the first active pattern ACT1, the second active pattern ACT2, the third active pattern ACT3, and the fourth active pattern ACT4 and the connection of the gate layers GL become different.

Further, another difference is that the elongation directions of the first selection gate SEL1, the second selection gate SEL2, and the source follower gate SF are substantially the same.

According to an embodiment of FIG. 11, the first selection gate SEL1 may be disposed on the first active pattern ACT1 disposed on the one side of the separating region DCC in the first direction X, and the second selection gate SEL2 may be disposed on the third active pattern ACT3 disposed on the other side of the separating region DCC in the first direction X.

For example, the first selection gate SEL1 may be disposed on the first active pattern ACT1 overlapping the third photodiode PD3 in the second sub-pixel group SPX2, and the second selection gate SEL2 may be disposed on the third active pattern ACT3 overlapping the eighth photodiode PD8 in the fourth sub-pixel group SPX4. The first selection gate SEL1 and the second selection gate SEL2 may extend in the first direction X.

The source follower gate SF may traverse the vertical pixel separating pattern DTI_V, and may extend in the first direction X to reach the third active pattern ACT3 from the first active pattern ACT1. Hence, at least part of the source follower gate SF may be disposed on the vertical pixel separating pattern DTI_V, and may overlap the vertical pixel separating pattern DTI_V in the third direction Z.

The source follower gate SF may include a first source follower gate SF1 disposed on the first active pattern ACT1 and a second source follower gate SF2 disposed on the third active pattern ACT3. That is, the first source follower gate SF1 and the second source follower gate SF2 may be integrally formed.

The first source follower gate SF1 may overlap part of the first active pattern ACT1 disposed on the other side of the separating region DCC in the first direction X, in the third direction Z.

For example, the first source follower gate SF1 may be disposed on the first active pattern ACT1 overlapping the fourth photodiode PD4 in the second sub-pixel group SPX2.

The second source follower gate SF2 may overlap part of the third active pattern ACT3 disposed on the one side of separating region DCC in the first direction X, in the third direction Z.

For example, the second source follower gate SF2 may be disposed on the third active pattern ACT3 overlapping the seventh photodiode PD7 in the fourth sub-pixel group SPX4.

The first conversion gate DCG1 may be disposed on the second active pattern ACT2 disposed on the one side of the separating region DCC in the first direction X.

For example, the first conversion gate DCG1 may be disposed on the second active pattern ACT2 overlapping the first photodiode PD1 in the first sub-pixel group SPX1.

The second conversion gate DCG2 may be disposed on the second active pattern ACT2 disposed on the other side of the separating region DCC in the first direction X.

For example, the second conversion gate DCG2 may be disposed on the second active pattern ACT2 overlapping the second photodiode PD2 in the first sub-pixel group SPX1.

The dummy gate DMY_G may be disposed on the fourth active pattern ACT4 disposed on the one side of the separating region DCC in the first direction X.

For example, the dummy gate DMY_G may be disposed on the fourth active pattern ACT4 overlapping the fifth photodiode PD5 in the third sub-pixel group SPX3.

The reset gate RG may be disposed on the fourth active pattern ACT4 disposed on the other side of the separating region DCC in the first direction X.

For example, the reset gate RG may be disposed on the fourth active pattern ACT4 overlapping the sixth photodiode PD6 in the third sub-pixel group SPX3.

The first conversion gate DCG1, the second conversion gate DCG2, the dummy gate DMY_G, and the reset gate RG may extend in the first direction X. That is, the elongation directions of the first conversion gate DCG1, the second conversion gate DCG2, the dummy gate DMY_G, and the reset gate RG and the elongation directions of the first selection gate SEL1, the second selection gate SEL2, and the source follower gate SF may be substantially the same first direction X.

The configuration and positioning of the gate layers GL disposed on the second active pattern ACT2 and the fourth active pattern ACT4 may not be limited thereto and may be changeable in various ways. Further, the elongation directions of the gate layers GL disposed on the first active pattern ACT1, the second active pattern ACT2, the third active pattern ACT3, and the fourth active pattern ACT4 may not be limited thereto and may be changeable in many ways without departing from the scope of the present disclosure.

A color filter and a micro lens of the image sensor, according to an embodiment, are described with reference to FIG. 12 to FIG. 15.

Figure 12:
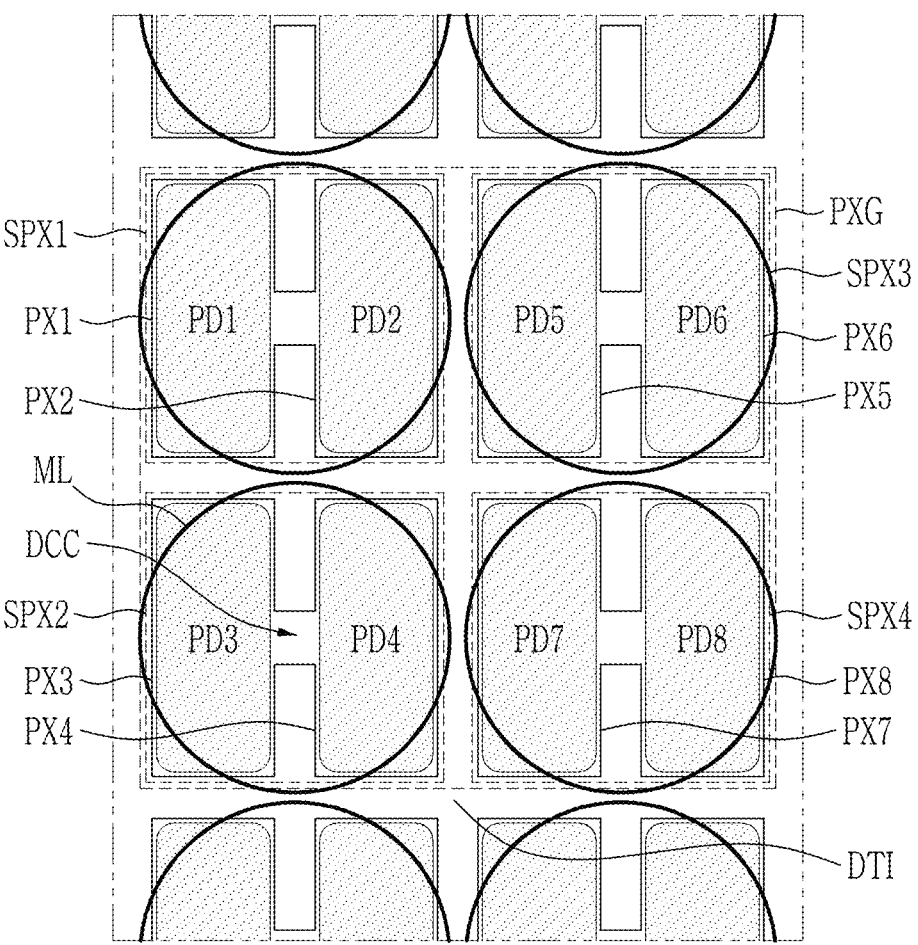
FIG. 12 and FIG. 13 shows plan views of a micro lens of an image, sensor, according to an embodiment.
Figure 12:
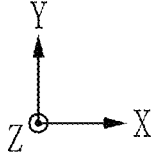
Figure 13:
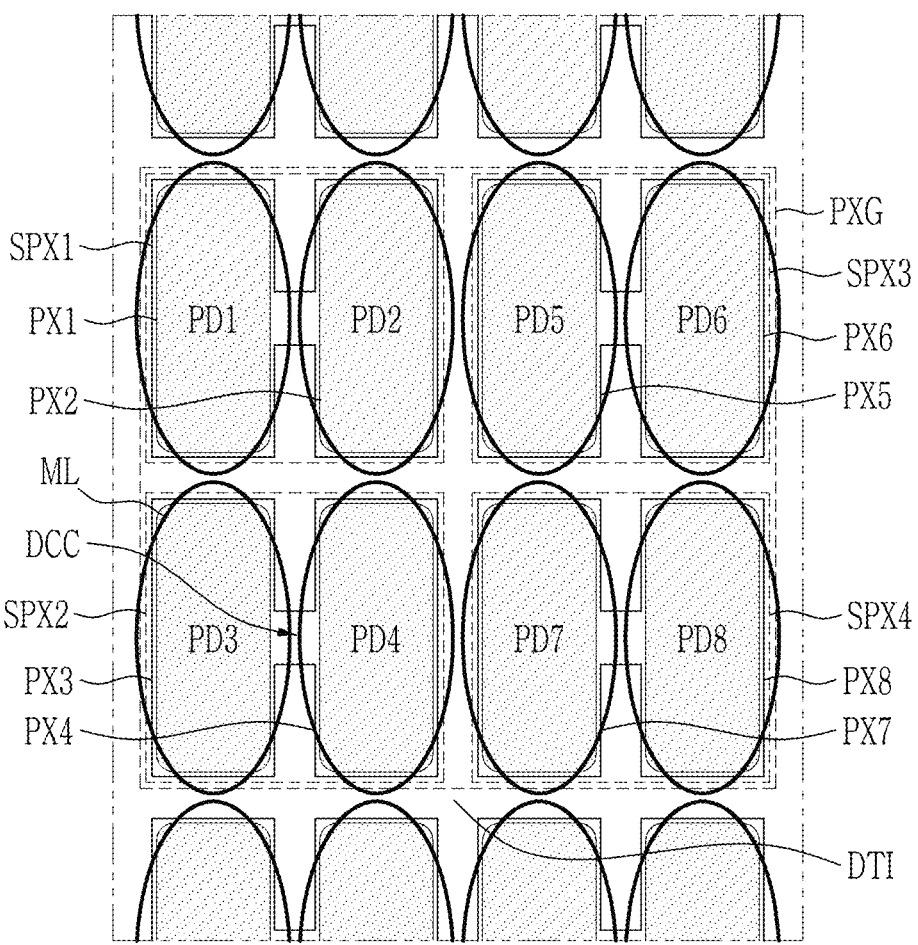
Figure 13:
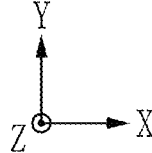
Figure 14:
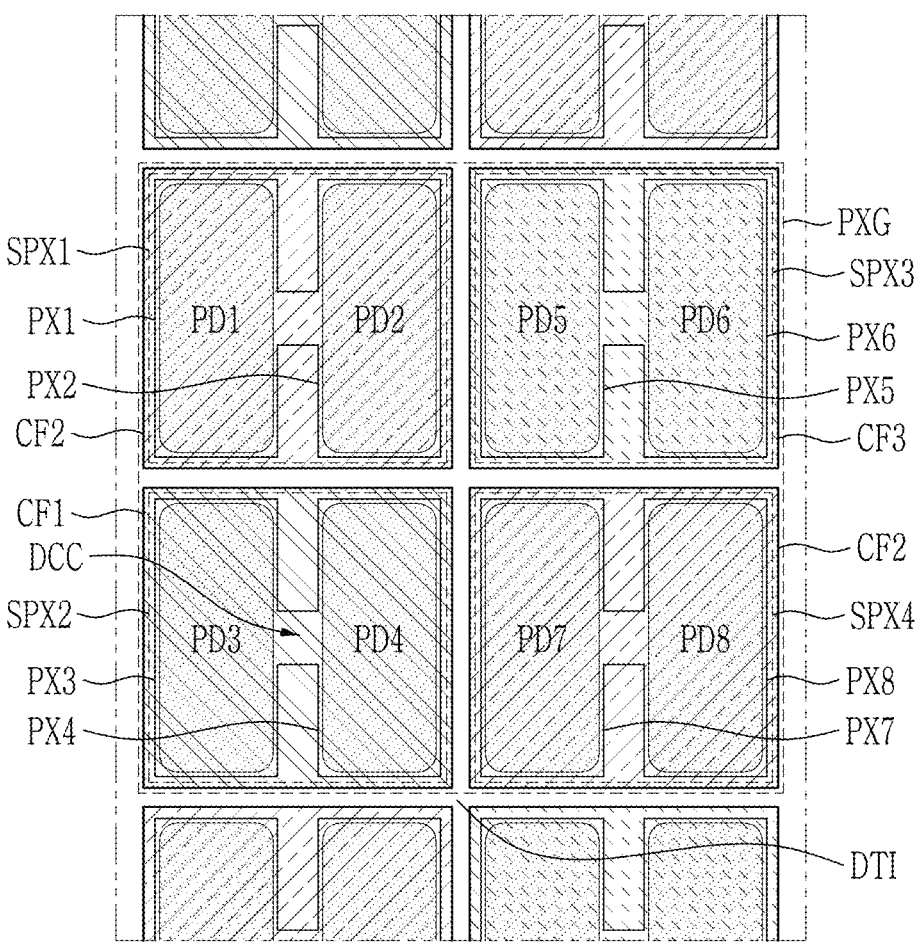
FIG. 14 and FIG. 15 shows plan views of a color filter of an image sensor, according to an embodiment.
Figure 14:
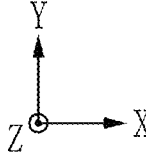
Figure 15:
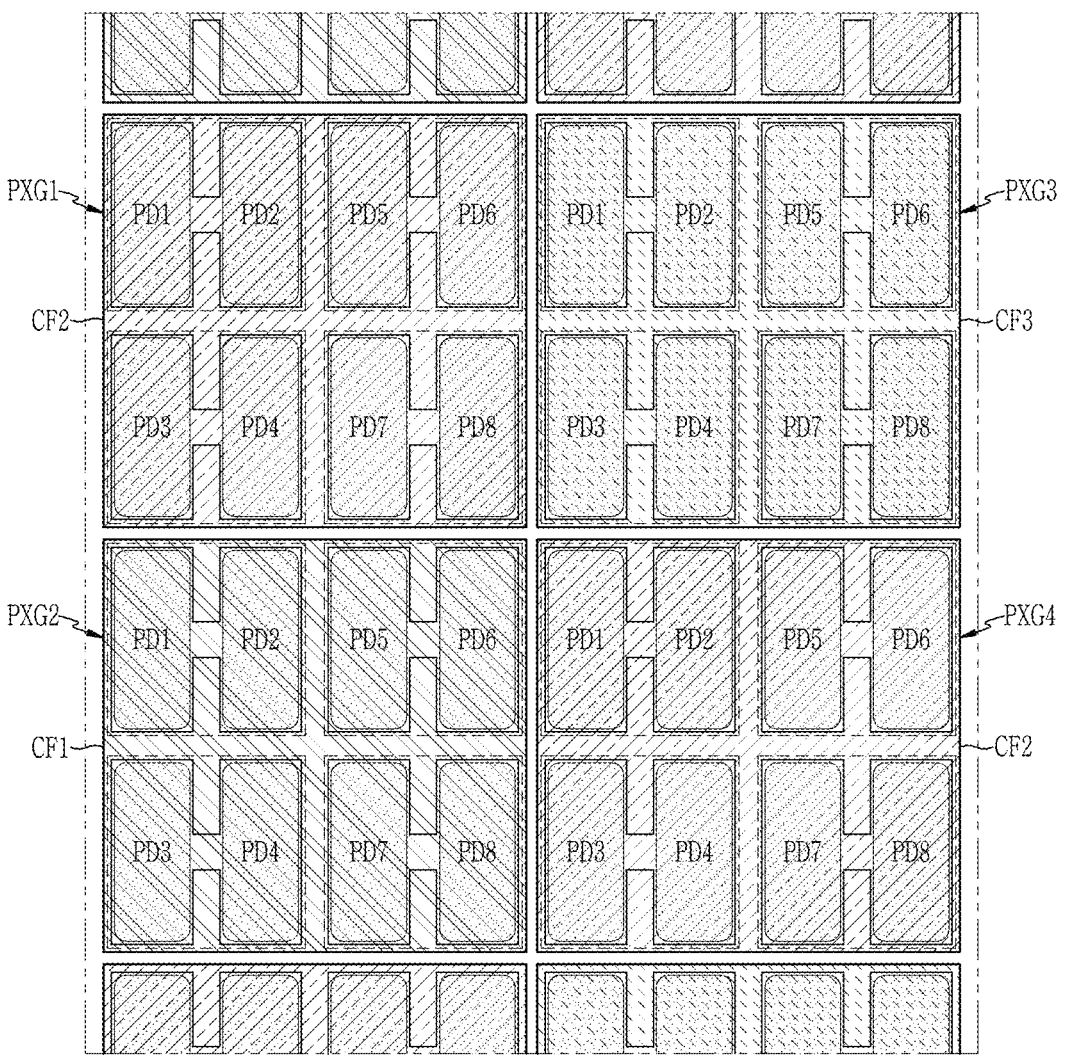
Figure 15:
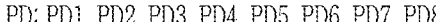
Figure 15:
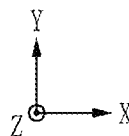

FIG. 12 and FIG. 13 shows plan views of a micro lens of an image sensor, according to an embodiment. FIG. 14 and FIG. 15 shows plan views of a color filter of an image sensor, according to an embodiment.

Referring to FIG. 12 and FIG. 13, micro lenses ML for collecting light input from the outside may be disposed on the respective photodiodes PD.

In an embodiment, an upper side of the micro lens ML may be a curve.

However, without being limited thereto, the upper side of the micro lens ML may have corners in a round quadrangular shape in some embodiments.

The number of the photodiodes PD corresponding to one micro lens ML may be changeable in many ways without departing from the scope of the present disclosure. For example, the photodiodes PD in an N×M arrangement may correspond to the one micro lens ML. Here, N and M may respectively be a positive integer greater than zero (0).

For example, as shown in FIG. 12, N may be equal to one (1) and M may be equal to two (2) so two (2) photodiodes PD may correspond to one (1) micro lens ML.

However, without being limited thereto, the number of the photodiodes PD corresponding to one micro lens ML may be changeable in many ways without departing from the scope of the present disclosure. For example, as shown in FIG. 13, the micro lenses ML may be disposed to correspond to the respective photodiodes PD. That is, one micro lens ML may be disposed on one photodiode PD. That is, a ratio of the number of the photodiodes PD to the number of the micro lenses ML may be 1:1.

Referring to FIG. 14 and FIG. 15, as described above, the color filters CF may be disposed corresponding to the photodiodes PD.

The photodiodes PD in an N×M arrangement may correspond to one color filter CF. For example, the photodiodes PD in an N×M arrangement may correspond to one color filter CF. As another example, N may be equal to one (1) and M may be equal to two (2) so the color filters CF may be disposed corresponding to the two (2) photodiodes PD.

The color filters CF may include a first color filter CF1, a second color filter CF2, and a third color filter CF3. For example, the first color filter CF1 may be a red color filter, the second color filter CF2 may be a green color filter, and the third color filter CF3 may be a blue color filter.

In an embodiment, the color filters CF may have a Bayer pattern on a plane. For example, the color filters CF may have a pattern so that the number of the second color filters CF2 may be about twice (e.g., x2) the number of the first color filters CF1 or the number of the third color filters CF3.

That is, the Bayer pattern may include two (2) second color filters CF2 disposed in diagonal directions to each other and a first color filter CF1 and a third color filter CF3 disposed in diagonal directions to each other in the color filter CF arranged in a 2×2 form in a plan view. The first color filter CF1 and the third color filter CF3 may be respectively disposed among the adjacent second color filters CF2. The color filters CF according to the Bayer pattern method may be repeatedly arranged in the first direction X and the second direction Y.

However, without being limited thereto, the number of the photodiodes PD corresponding to one color filter CF may be changed in many ways without departing from the scope of the present disclosure. For example, as shown in FIG. 15, the color filters CF may be disposed corresponding to the respective pixel group PXG. For example, N may be equal to two (2) and M may be equal to four (4) so the color filters CF may be disposed corresponding to the eight (8) photodiodes PD.

Example applications of the image sensor, according to various embodiments, are described with reference to FIG. 16 to FIG. 19.

FIG. 16 to FIG. 19 show various examples of an electronic device to which image sensors are applied, according to some embodiments.

Figure 16:
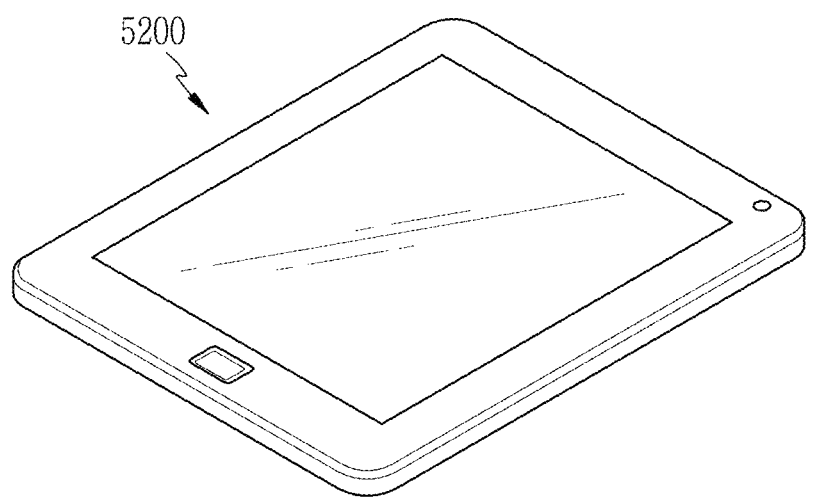
FIG. 16 to FIG. 19 show various examples of an electronic device to which image sensors are applied, according to some embodiments.
Figure 17:
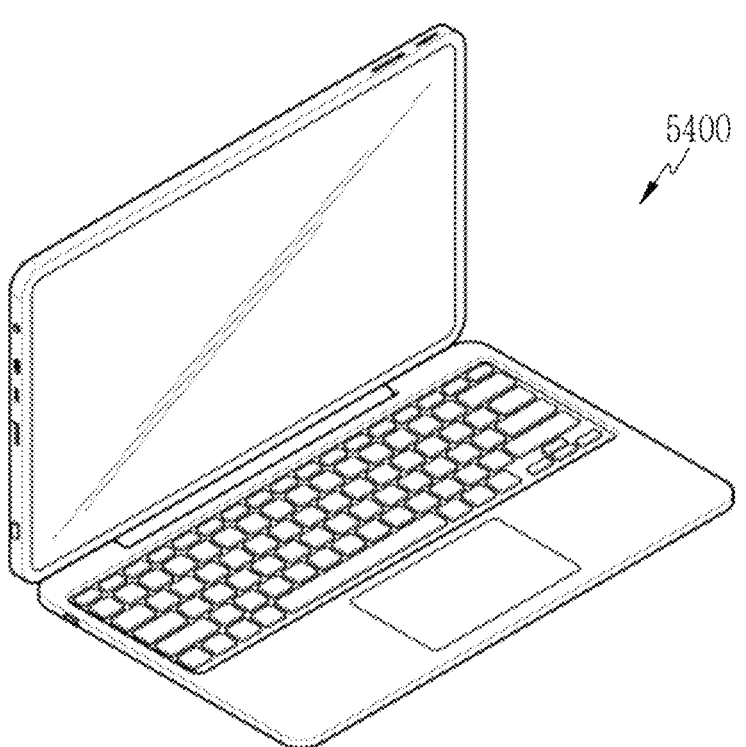
Figure 18:
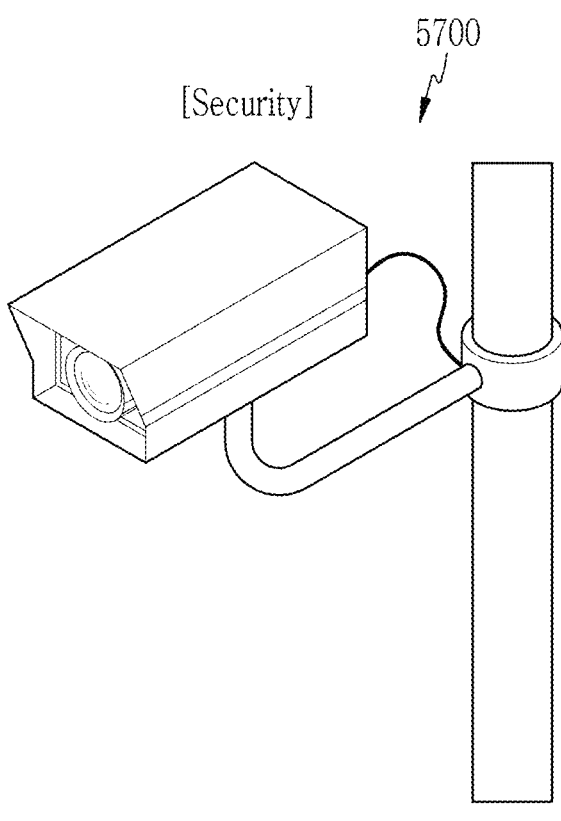

For example, the image sensor 100 may be applied to a mobile device such as, but not limited to, a mobile phone, a smartphone, a tablet PC, or a smart tablet PC 5200 shown in FIG. 16, a laptop computer 5400 shown in FIG. 17, and/or a security camera 5700 shown in FIG. 18.

For example, the smartphone or the smart tablet PC 5200 may include high-resolution cameras in which a high-resolution image sensor is respectively installed. By using the high-resolution cameras, depth information of subjects in the images may be extracted, out-focusing of the images may be adjusted, and/or the subjects in the images may be automatically identified. However, the present disclosure is not limited in this regard. The security camera 5700 may provide super high-resolution images and may recognize objects and/or persons in the images under dark conditions by using high sensitivity.

Figure 19:
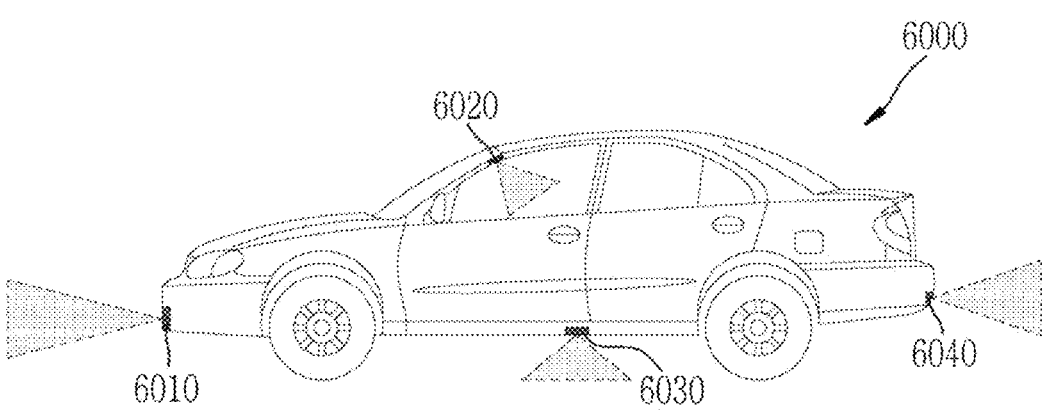

Further, the image sensor 100 may be applied to the vehicle 6000, as shown in FIG. 19. The vehicle 6000 may include vehicle cameras (e.g., a first vehicle camera 6010, a second vehicle camera 6020, a third vehicle camera 6030, and a fourth vehicle camera 6040) disposed on the various positions, and the respective first to fourth vehicle cameras 6010 to 6040 may include an image sensor according to an embodiment. The vehicle 6000 may provide various kinds of information on inside or near the vehicle 6000 to a driver by using the first to fourth vehicle cameras 6010 to 6040, and may provide automatically detect the objects and/or people in the images and/or may provide information needed to autonomous driving.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. An image sensor, comprising:
a substrate;
a plurality of photodiodes in the substrate;
a pixel separating pattern in the substrate and configured to separate the plurality of photodiodes;
a first active pattern in the substrate and configured to at least partially overlap a first photodiode and a second photodiode from among the plurality of photodiodes, the first photodiode being adjacent to the second photodiode; and
a selection gate on the first active pattern and configured to at least partially overlap the first photodiode; and a source follower gate on the first active pattern and configured to at least partially overlap the second photodiode, wherein the pixel separating pattern comprises a first pixel separating pattern and a second pixel separating pattern disposed between the first photodiode and the second photodiode, the first pixel separating pattern being spaced from the second pixel separating pattern, wherein the first active pattern comprises:

a first extrinsic region disposed between the first pixel separating pattern and the second pixel separating pattern;

a second extrinsic region on a second side of the selection gate; and a third extrinsic region on a second side of the source follower gate, wherein the first extrinsic region and the second extrinsic region are on respective sides of the selection gate in a second direction, and wherein the first extrinsic region and the third extrinsic region are on respective sides of the source follower gate in a first direction.

2. The image sensor of claim 1, wherein the first extrinsic region extends between the first pixel separating pattern and the second pixel separating pattern, and wherein the first extrinsic region extends from a first side of the selection gate to a first side of the source follower gate.

3. The image sensor of claim 2, wherein the selection gate extends in the first direction, wherein the source follower gate extends in the second direction that crosses the first direction, and wherein a second length of the source follower gate in the second direction is greater than a first length of the selection gate in the first direction.

4. The image sensor of claim 3, wherein the first photodiode and the second photodiode are near each other in the first direction, and wherein the first photodiode and the second photodiode respectively have a rectangular shape comprising two short sides extending in the first direction and two long sides extending in the second direction.

5. The image sensor of claim 3, further comprising:

a second active pattern comprising a floating diffusion region; and a third active pattern of which at least part is surrounded by the second active pattern and comprising a ground region, wherein the third active pattern is spaced from the first active pattern in the second direction, and wherein the second active pattern is disposed between the first active pattern and the third active pattern.

6. The image sensor of claim 3, wherein an end of the source follower gate is disposed in a virtual extending line in the first direction, and wherein the virtual extending line is disposed between the first pixel separating pattern and the second pixel separating pattern.

7. The image sensor of claim 3, wherein an end of the source follower gate is disposed in a virtual extending line in the first direction, and wherein the virtual extending line is on at least one of an end of the first pixel separating pattern and an end of the second pixel separating pattern.

8. The image sensor of claim 2, wherein the first pixel separating pattern and the second pixel separating pattern are spaced from each other in at least one of a center of a border between the first photodiode and the second photodiode and an edge of one side of the border between the first photodiode and the second photodiode.

9. The image sensor of claim 2, wherein the selection gate and the source follower gate extend in the first direction.

10. An image sensor, comprising:

a substrate;

a plurality of photodiodes in the substrate;

a pixel separating pattern in the substrate and configured to separate the plurality of photodiodes;

a first active pattern in the substrate and configured to at least partially overlap a first photodiode and a second photodiode from among the plurality of photodiodes, the first photodiode being adjacent to the second photodiode in a first direction;

a second active pattern in the substrate and configured to at least partially overlap a third photodiode and a fourth photodiode from among the plurality of photodiodes, the third photodiode being adjacent to the fourth photodiode in the first direction, the third photodiode and the fourth photodiode being adjacent to the first photodiode and the second photodiode in a second direction, the second direction crossing the first direction;

a source follower gate on the first active pattern and the second active pattern and configured to at least partially overlap the second photodiode and the fourth photodiode;

a first selection gate on the first active pattern and configured to at least partially overlap the first photodiode; and a second selection gate on the second active pattern and configured to at least partially overlap the third photodiode, wherein the pixel separating pattern comprises:

a first pixel separating pattern and a second pixel separating pattern disposed between the first photodiode and the second photodiode, the first pixel separating pattern and the second pixel separating pattern being separated from each other; and a third pixel separating pattern and a fourth pixel separating pattern disposed between the third photodiode and the fourth photodiode, the third pixel separating pattern and the fourth pixel separating pattern being separated from each other, wherein the source follower gate comprises:

a first source follower gate at least partially overlapping the first active pattern; and a second source follower gate at least partially overlapping the second active pattern, wherein the first active pattern comprises:

a first extrinsic region disposed between the first pixel separating pattern and the second pixel separating pattern;

a third extrinsic region on a second side of the first selection gate; and a fourth extrinsic region on a second side of the first source follower gate, wherein the first extrinsic region and the third extrinsic region are on respective sides of the first selection gate in the second direction, wherein the first extrinsic region and the fourth extrinsic region are on respective sides of the first source follower gate in the first direction, and wherein the second active pattern comprises a second extrinsic region disposed between the third pixel separating pattern and the fourth pixel separating pattern.

11. The image sensor of claim 10, wherein the first extrinsic region extends between the first pixel separating pattern and the second pixel separating pattern, wherein the first extrinsic region extends from a first side of the first selection gate to a first side of the first source follower gate, wherein the second extrinsic region extends between the third pixel separating pattern and the fourth pixel separating pattern, and wherein the second extrinsic region extends from a first side of the second selection gate to a first side of the second source follower gate.

12. The image sensor of claim 11, wherein the first selection gate and the second selection gate extend in the first direction, wherein the first source follower gate and the second source follower gate extend in the second direction, wherein a second length of the first source follower gate in the second direction is greater than a first length of the first selection gate in the first direction, and wherein a third length of the second source follower gate is greater than a fourth length of the second selection gate in the first direction.

13. The image sensor of claim 12, wherein the first active pattern and the second active pattern are symmetric in the second direction with respect to the pixel separating pattern, wherein the second active pattern further comprises:

a fifth extrinsic region on a second side of the second selection gate; and a sixth extrinsic region on a second side of the second source follower gate, wherein the second extrinsic region and the fifth extrinsic region are on respective sides of the second selection gate in the second direction, and wherein the second extrinsic region and the sixth extrinsic region are on respective sides of the second source follower gate in the first direction.

14. The image sensor of claim 13, further comprising:

a first connection wire coupling the third extrinsic region and the fifth extrinsic region, and a second connection wire coupling the fourth extrinsic region and the sixth extrinsic region.

15. The image sensor of claim 11, further comprising:

a third active pattern symmetrically disposed with the first active pattern in the first direction with the pixel separating pattern therebetween;

a fourth active pattern symmetrically disposed with the second active pattern in the first direction with the pixel separating pattern therebetween;

a first conversion gate on the third active pattern and extending in the second direction;

a second conversion gate on the third active pattern and extending in the first direction; and a reset gate on the fourth active pattern and extending in the second direction.

16. The image sensor of claim 11, wherein a first side end of the source follower gate is disposed in a first virtual extending line in the first direction, wherein the first virtual extending line is disposed between the first pixel separating pattern and the second pixel separating pattern, wherein a second side end of the source follower gate is disposed in a second virtual extending line in the first direction, and wherein the second virtual extending line is disposed between the third pixel separating pattern and the fourth pixel separating pattern.

17. An image sensor, comprising:

a substrate comprising a first side and a second side facing each other;

a plurality of photodiodes in the substrate;

a pixel separating pattern separating the plurality of photodiodes in the substrate;

an active pattern on an inner side from the first side of the substrate and configured to at least partially overlap a first photodiode and a second photodiode from among the plurality of photodiodes, the first photodiode being adjacent to the second photodiode;

a selection gate on the active pattern and configured to at least partially overlap the first photodiode;

a source follower gate spaced from the selection gate on the active pattern and configured to at least partially overlap the second photodiode; and a micro lens on the second side of the substrate, wherein the pixel separating pattern comprises a first pixel separating pattern and a second pixel separating pattern disposed between the first photodiode and the second photodiode, the first pixel separating pattern being spaced from the second pixel separating pattern, and wherein the active pattern comprises:

a first extrinsic region disposed between the first pixel separating pattern and the second pixel separating pattern;

a second extrinsic region on a second side of the selection gate and at least partially overlapping the first photodiode; and a third extrinsic region on a second side of the source follower gate and at least partially overlapping the second photodiode.

18. The image sensor of claim 17, wherein the first extrinsic region extends between the first pixel separating pattern and the second pixel separating pattern, and wherein the first extrinsic region extends from a first side of the selection gate to a first side of the source follower gate.

* * * * *